(12) United States Patent
Scherer

(10) Patent No.: US 7,443,902 B2
(45) Date of Patent: Oct. 28, 2008

(54) LASER-BASED OPTICAL SWITCHES AND LOGIC

(75) Inventor: Axel Scherer, Laguna Beach, CA (US)

(73) Assignee: California Institute of Technology, Pasadena, CA (US)

( * ) Notice: Subject to any disclaimer, the term of this patent is extended or adjusted under 35 U.S.C. 154(b) by 397 days.

(21) Appl. No.: 10/967,080

(22) Filed: Oct. 15, 2004

(65) Prior Publication Data

US 2005/0152429 A1 Jul. 14, 2005

Related U.S. Application Data

(60) Provisional application No. 60/511,753, filed on Oct. 15, 2003.

(51) Int. Cl.
*H01S 3/082* (2006.01)

(52) U.S. Cl. .......................................... 372/97; 385/129

(58) Field of Classification Search ................ 372/92, 372/20, 97; 438/92, 29
See application file for complete search history.

(56) References Cited

U.S. PATENT DOCUMENTS

| | | | |
|---|---|---|---|
| 3,828,231 A | 8/1974 | Yamamoto | |
| 5,299,054 A | 3/1994 | Geiger | |
| 5,365,541 A | 11/1994 | Bullock | |
| 6,400,495 B1 | 6/2002 | Zayhowski | |
| 6,597,721 B1* | 7/2003 | Hutchinson et al. | 372/98 |
| 6,674,778 B1 | 1/2004 | Lin et al. | |
| 6,704,343 B2* | 3/2004 | Deng et al. | 372/97 |
| 6,711,200 B1 | 3/2004 | Scherer et al. | |
| 6,804,283 B2 | 10/2004 | Scherer | |
| 6,829,281 B2* | 12/2004 | Deng et al. | 372/96 |
| 6,853,658 B1 | 2/2005 | DiJaili et al. | |
| 7,072,369 B2 | 7/2006 | Matsushita et al. | |
| 7,082,235 B2 | 7/2006 | Gunn | |
| 7,113,329 B2 | 9/2006 | DiJaili et al. | |
| 7,233,729 B2* | 6/2007 | Romagnoli et al. | 385/129 |
| 2002/0163947 A1 | 11/2002 | Ostergaard et al. | |
| 2002/0167984 A1 | 11/2002 | Scherer | |
| 2003/0032204 A1 | 2/2003 | Walt et al. | |
| 2003/0106487 A1 | 6/2003 | Huang | |
| 2005/0157974 A1 | 7/2005 | Scherer | |
| 2005/0158898 A1 | 7/2005 | Scherer | |
| 2005/0163419 A1 | 7/2005 | Scherer | |

(Continued)

OTHER PUBLICATIONS

U.S. Appl. No. 10/967,083, entitled Optical Switching and Logic Systems and Methods, filed Oct. 15, 2004.

(Continued)

*Primary Examiner*—Minsun Harvey
*Assistant Examiner*—Tuan N. Nguyen
(74) *Attorney, Agent, or Firm*—Knobbe, Martens, Olson & Bear, LLP

(57) ABSTRACT

Optical switches and logic devices comprising microstructure-doped nanocavity lasers are described. These switches and logic devices have gain and thus can be cascaded and integrated in a network or system such as for example on a chip. Exemplary switching elements switch the intensity, wavelength, or direction of the output. Exemplary logic devices include AND, OR, NAND, NOR, NOT, and XOR gates as well as flip-flops. Microfluidic sorting and delivery as well as optical tweezing and trapping may be employed to select and position a light emitter in a nanooptical cavity to form the nanolaser.

43 Claims, 22 Drawing Sheets

U.S. PATENT DOCUMENTS

2006/0175601 A1    8/2006    Lieber et al.

OTHER PUBLICATIONS

U.S. Appl. No. 10/967,110, entitled Optical Switches and Logic and Methods of Implementation, filed Oct. 15, 2004.
U.S. Appl. No. 10/967,072, entitled Methods of Forming Nanocavity Laser Structures, filed Oct. 15, 2004.
Dae-Sung, Song et al. "Single-fundamental-mode photonic-crystal vertical-cavity surface-emitting lasers" Applied Physics Letters, vol. 80, No. 21, May 27, 2002, pp. 3901-3903.
Dae-Sung, Song et al. "Single-fundamental-mode photonic-crystal vertical-cavity surface-emitting laser" Tuesday Afternoon/ CLEO2002/ pp. 293-294.
Francisco M. Raymo "Digital Processing and communication with Molecular switches" Advance Material, 2002, 14, No. 6 Mar. 18, pp. 401-414.
Robert McLeod et al "(3+1) dimensional optical soliton dragging logic" Physical Review A, vol. 52, No. 4 Oct. 1995, pp. 3254-3278.
Axel Scherer et al. "Photonic Bandgap Microcavity Devices" Thursday Morning / OFC, Mar. 27, 2003, p. 1.
U.S. Appl. No. 10/967,083—Office Action—Nov. 1, 2006.
U.S. Appl. No. 10/967,083—Notice of Abandonment—May 14, 2007.
U.S. Appl. No. 10/967,110—Office Action—Oct. 31, 2006.
U.S. Appl. No. 10/967,110—Response to Office Action—Dec. 28, 2006.
U.S. Appl. No. 10/967,110—Office Action—Feb. 12, 2007.
U.S. Appl. No. 10/967,110—Response to Office Action—May 14, 2007.
U.S. Appl. No. 10/967,110—Office Action—Jun. 11, 2007.
U.S. Appl. No. 10/967,072—Office Action—Oct. 10, 2006.
U.S. Appl. No. 10/967,072—Response to Office Action—Jan. 15, 2007.
U.S. Appl. No. 10/967,072—Office Action—Apr. 9, 2007.
U.S. Appl. No. 10/967,072—Response to Office Action—Oct. 9, 2007.
Noda, Susumu et al. Trapping and emission of photons by a single defect in a photonic bandgap structure. Nature, vol. 407, Oct. 2000, pp. 608-610.
Scherer, Axel; National Science Foundation Workshop Presentation; Photonic Crystals for Generation-After-Next Lightwave Systems; Dec. 4, 2000; http://csi.usc.edu/Willner.NSF/program.html; http://csi.usc.edu/Willner.NSF/presentations.html.
Dholakia, Kishan et al.; Physics World; Optical Tweezers: The next generation; Oct. 2002; http://ww.st-andrews.ac.uk/~atomtrap/papers/PWOCT02optical-tweezers.pdf, pp. 31-35.
U.S. Appl. No. 10/967,110 - Response to Office Action dated Dec. 10, 2007.
U.S. Appl. No. 10/967,110 - Office Action dated Jan. 3, 2008.
U.S. Appl. No. 10/967,072 - Notice of Allowance dated Nov. 2, 2007.

\* cited by examiner

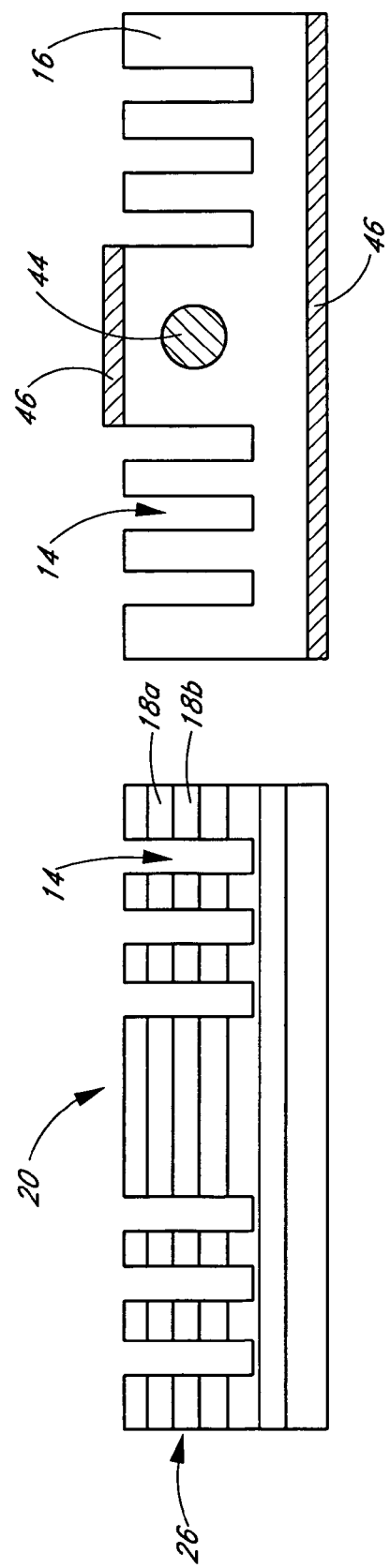

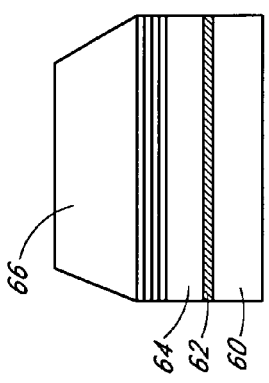
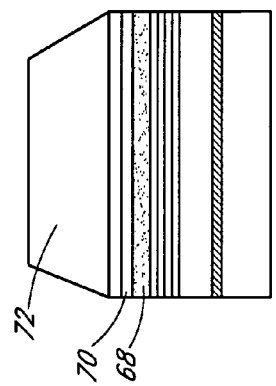
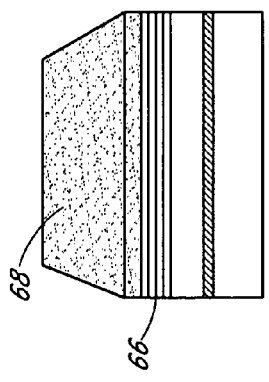
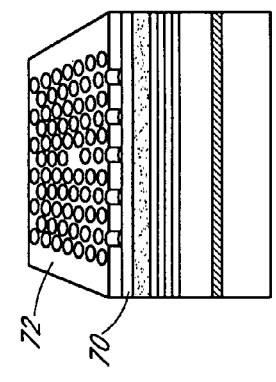
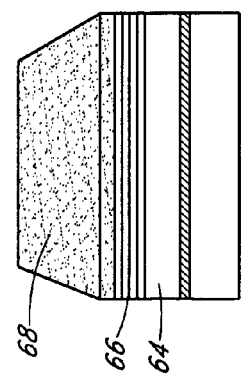
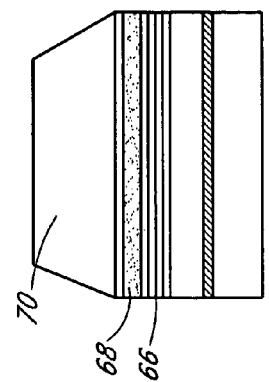
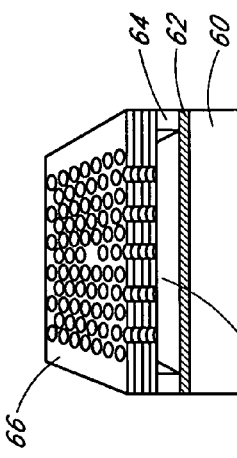
FIG. 8A  FIG. 8B  FIG. 8C
FIG. 8D  FIG. 8E  FIG. 8F
FIG. 8G  FIG. 8H  FIG. 8I

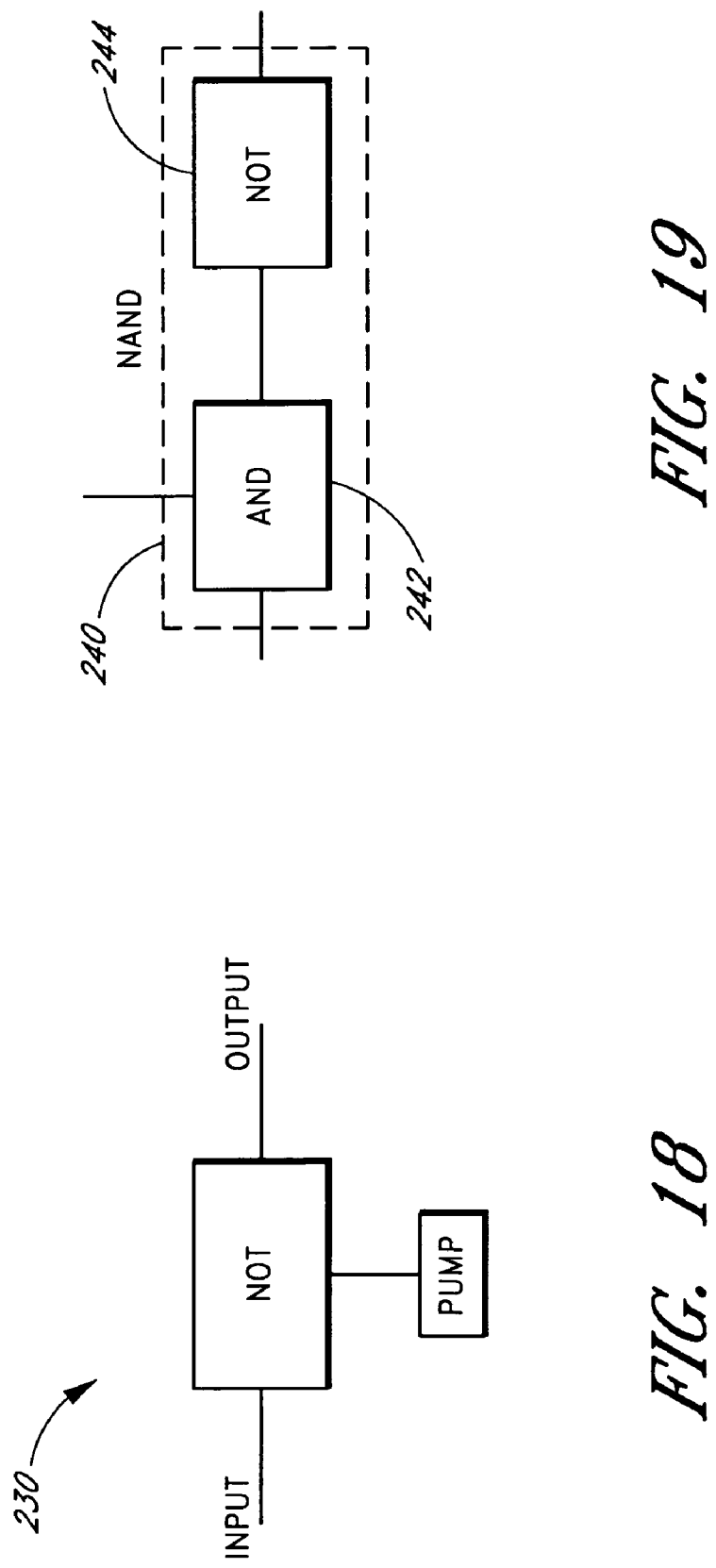

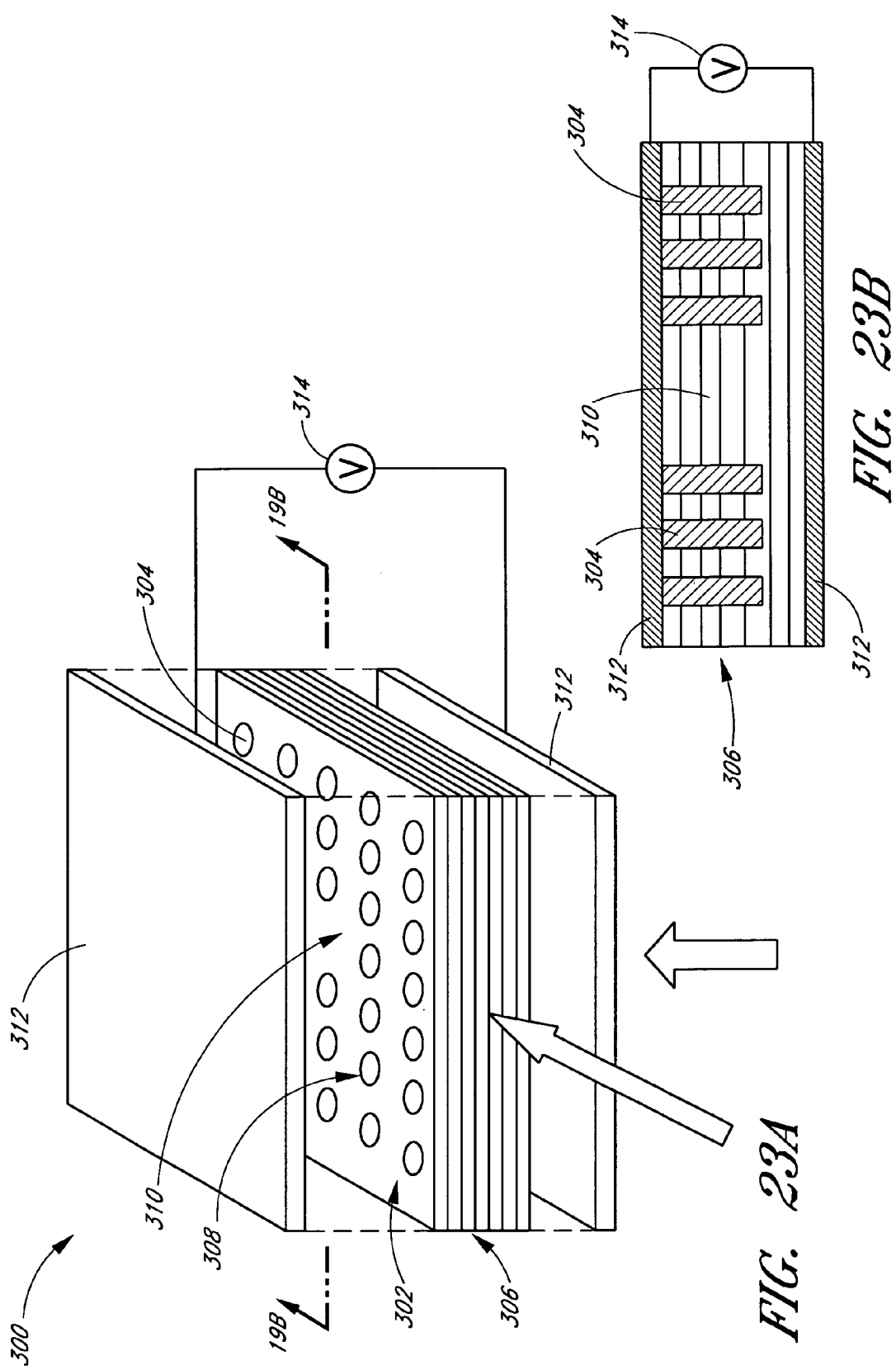

LASER-BASED OPTICAL SWITCHES AND LOGIC

PRIORITY APPLICATION

This application claims the benefit of U.S. Provisional Application No. 60/511,753, entitled "Optical Logic With Gain: Photonic Crystal Nanocavity Switches," filed Oct. 15, 2003, the entire disclosure of which is hereby incorporated by reference herein and made a part of this specification.

The U.S. Government has certain rights in this invention pursuant to Grant No. F49620-02-1-0418 awarded by The Air Force Office of Scientific Research.

BACKGROUND OF THE INVENTION

1. Field of the Invention

The present teachings relate to optical switches and optical logic having gain and methods of implementing switching and logic with laser structures.

2. Description of the Related Art

Light offers many advantages when used to propagate information, the foremost of which are increased speed and bandwidth. In comparison with electrical signals, signals transmitted optically can be modulated faster and can include an even greater number of separate channels multiplexed together. The signal may correspond to voice or data which is to be transmitted over a distance between, e.g., two phones across the country or the world, two computers in a network, or two components in a computer.

To increase data throughput, numerous optical signals at different wavelengths can be multiplexed and transmitted together along a single optical path. This optical path can be selectively switched and varied to direct the different optical signals such as different channels to the appropriate destination. Accordingly, fast optical switches for switching are desirable.

If available, optical logic components for processing and manipulating optical signals could be used to implement more sophisticated logical operations optically. In addition to a voice or data communication system, such logic components may be employed in optical computing and optical signal processing.

What is needed is therefore are optical switches and optical logic devices and method of implementing switching and optical logic at high data rates. Combining these components into a system that is integrated onto a single substrate is also highly desirable.

SUMMARY OF THE INVENTION

One embodiment of the invention comprises an optical logic device comprising a laser, a pump, at least one optical input port, and at least one optical output port. The laser comprises an optical resonator and a gain region therein. The optical resonator comprises counter-opposing microstructure-doped mirror portions. The gain region is disposed between the mirror portion. The microstructure-doped mirror portions are comprised of a plurality of microstructures disposed in an optically transmissive structure. The pump is disposed with respect to the optical resonator to pump the gain region. The at least one optical input port is disposed with respect to the optical resonator to couple light into the gain region. The at least one optical output port is disposed with respect to the optical resonator to couple light out of the gain region. The laser has at least a first state and a second state that affect a characteristic of light coupled out the at least one optical output port. Light coupled into the at least one optical input port switches the laser from the first state to the second state.

Another embodiment of the invention comprises an electrically tunable optical logic device comprising a laser, a pump, a plurality of electrodes, at least one optical input port, and at least one optical output port. The laser comprises an optical resonator and a gain region therein. The optical resonator comprises counter-opposing microstructure-doped mirror portions. The microstructure-doped mirror portions comprise of a plurality of microstructures disposed in an optically transmissive medium. At least a portion of the optical resonator comprises electro-optic material having an index of refraction that varies with applied electric field. The pump is configured to pump the gain region. The plurality of electrodes are arranged to apply an electric field through the electro-optic material to vary the index of refraction. The optical resonator has an effective index of refraction that can thereby be altered. The at least one optical input port disposed with respect to the optical resonator to couple light into the gain region. The at least one optical output port disposed with respect to the optical resonator to couple light out of the gain region. The laser has at least a first state and a second state that affect a characteristic of light coupled out of the at least one optical output port. Light coupled into the at least one optical input port switches the laser from the first state to the second state. The electric field created by the electrodes alters the strength of at least one optical mode supported by the optical resonator.

Another embodiment of the invention comprises a method of implementing logic operations. This method comprising pumping a nanocavity laser comprising an optical cavity and a light emitter in the optical cavity. The optical cavity is formed by reflective portions comprising an array of point structures. The nanocavity laser has an optical output that is different for different states of the nanocavity laser. The method further comprises inputting at least one optical signal into the optical cavity to alter the state of the nanocavity laser thereby altering the optical output of the nanocavity laser.

BRIEF DESCRIPTION OF THE DRAWINGS

FIG. 2 is a cross-sectional view of the optical logic device shown in FIG. 1 across the line 2-2 schematically illustrating the microstructures in the multiple quantum well.

FIG. 3 is a cross-sectional view of an embodiment of the optical logic device that includes a quantum dot for emitting light and providing optical gain.

FIGS. 8A-8I schematically illustrate an exemplary process for forming the optical logic device.

FIG. 18 schematically illustrates a NOT gate.

FIG. 19 schematically illustrates a NAND gate.

FIG. 23A is an exploded view of an embodiment of an electrostatically tunable optical logic device that includes electro-optic material and electrodes for applying an electric field through the electro-optic material.

FIG. 23B is a cross-sectional view of the optical logic device depicted in FIG. 23A that schematically illustrates the microstructures comprising electro-optic material disposed in the quantum well structure.

DETAILED DESCRIPTION OF THE PREFERRED EMBODIMENT

Figure 1:
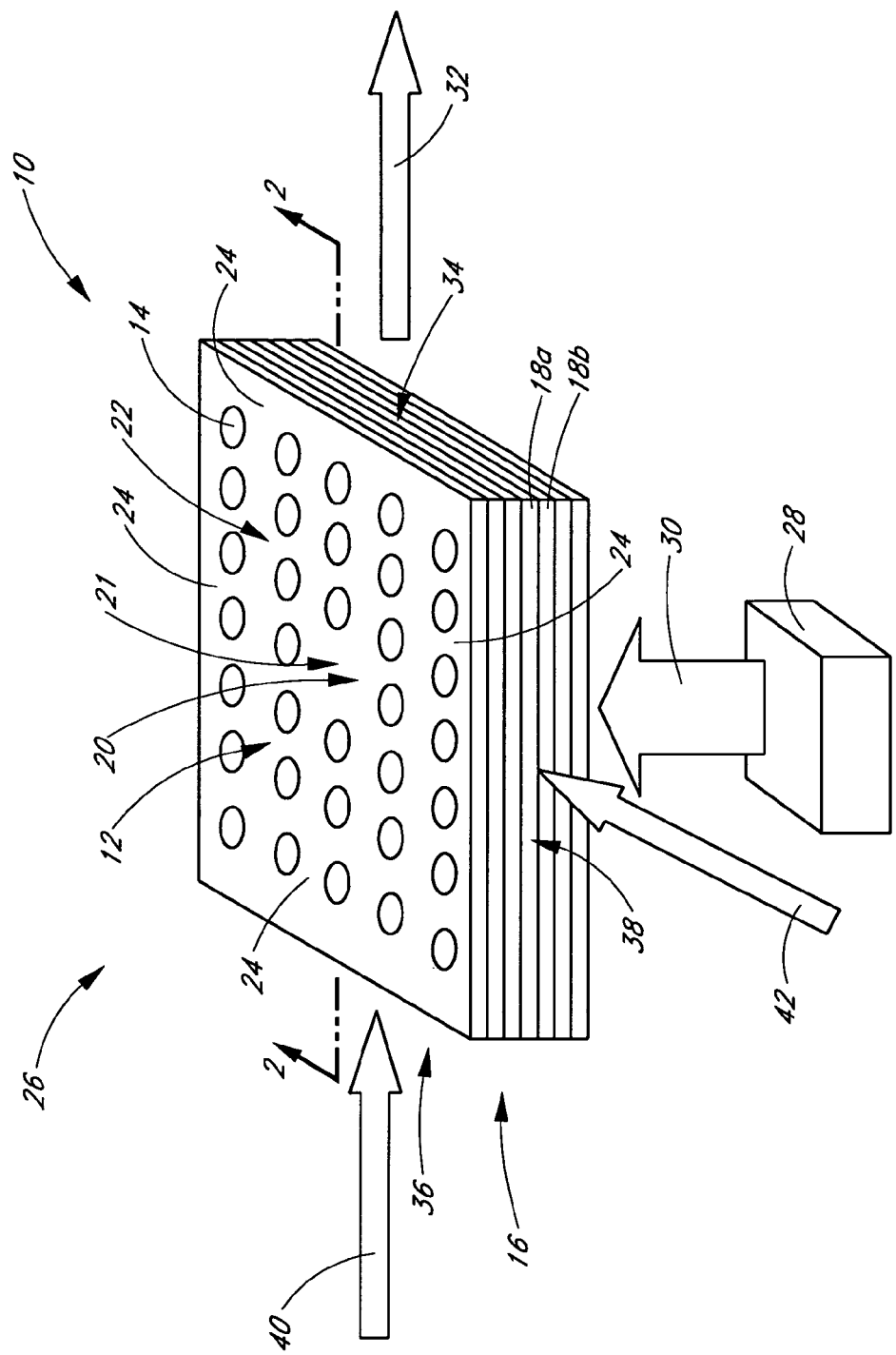
FIG. 1 is a schematic drawing of an optical logic device comprising a multiple quantum well structure having an array of microstructures disposed therein to form an optical cavity.

These and other aspects, advantages, and features of the present teachings will become apparent from the following detailed description and with reference to the accompanying drawings. In the drawings, similar elements have similar reference numerals.

An optical logic device 10 having gain is schematically illustrated in FIG. 1. This optical logic device 10 comprises an ordered array 12 of microstructures 14 disposed in a substantially optically transmissive medium 16 comprising a quantum well structure. The optically transmissive medium 16 or quantum well structure is referred to as being etched, with periodic microstructures 14 forming a microfabricated two-dimensional Bragg mirror. More generally, the optically transmissive medium is referred herein as being microstructured or microstructure-doped. This quantum well structure 16 is substantially optically transmissive to the wavelength of operation of the device 10. The quantum well structure 16 comprises a plurality of layers 18a, 18b that form wells (18a) and barrier regions (18b) as is well known in the art. These well and barrier layers 18a, 18b provide light emission when properly stimulated with energy, e.g., electrical current or optical power.

In the embodiment depicted in FIG. 1, the microstructures 14 are disposed in the layered quantum well structure 16 on opposite sides of a central region 20. This central region 20 contains no microstructure forming a defect 21 in the array 12. The absence of a microstructure 14 in the central region 20 creates an optical cavity 22, which is formed by counter-opposing portions 24 of the microstructure-doped optical transmissive medium 16. These microstructure-doped portions 24 are referred to generally as microstructure-doped mirror or reflector portions and may comprise Bragg mirrors or photonic bandgap mirrors as discussed more fully below. The mirror portions 24 of the optical cavity 22 provide two-dimensional optical confinement and concentrates light in the central region 20.

The central region 20 is also formed from the plurality of layers 18a, 18b of the quantum well structure 16 and as a result provides optical gain. Accordingly, this central region 20 is referred to as the gain region. The optical cavity 22 supports optical modes that are resonant and thus concentrated in the gain region 20.

In various embodiments, the optical cavity 22 comprises an optical nanocavity, an optical cavity having reduced dimension that supports few optical modes that can be fit into the reduced in dimension of the cavity. For example, the nanocavity can have a mode volume of between about one tenth of a cubic half wavelength and ten times a cubic half wavelength or between about 0.01 cubic micrometers and 1.0 cubic micrometers. Similarly the gain region 20 in the optical cavity 22 may vary be between about one atom and about 0.1 cubic micrometers in volume. For 1.5 micrometer wavelength light, for example, the nanocavity may have a lateral dimension of between about 100 nanometers to 500 nanometers. The thickness of the perforated medium 16 may vary from one quarter of the wavelength of light in the optical transmissive medium to one wavelength of light in the medium. As will be discussed more fully below, reduced cavity size increases the switching and processing speeds. Speeds between about 100 GHz and 200 GHz and even faster are therefore possible. Reduced cavity size also decreases the number of available modes which can reduce noise otherwise contributed by other modes. Values outside the ranges described above are also possible.

In various embodiments, the array of microstructures 12 that form the mirror portions 24 comprises photonic crystal. The microstructures 14 are spatially arranged to produce a forbidden frequency region wherein light within a specific band of wavelengths cannot propagate. This forbidden region corresponds to the light spectrum reflected by the mirror portions 24. Accordingly, light is confined to the gain region 20 by the surrounding mirror portions 24 where the light cannot propagate. The microstructures 14 are spatially arranged such that light within the gain region 20 that is incident on the array 12 is coherently scattered so as to produce destructive interference within the mirror portions 24 and beyond. The intensity of the light within the mirror portions 24 therefore exponentially decreases with distance to the optical cavity. In contrast, the microstructures 14 are spatially arranged so as to produce constructive interference within the gain region 20. In effect, the microstructures 14 act together as coherent Bragg scatterers, directing light back into the gain region 20.

In other embodiments, lateral confinement within the gain region 20 is provided by lowering the effective index of refraction in the mirror portions 24 of the optically transmissive structure 16. The microstructures 14 may, for example, be filled with air or vacuum providing them with a refractive index lower than the medium 16, which may comprise, e.g., III-V semiconductor material. Material having a refractive index at least about 2.0 is preferred. Accordingly, the average refractive index of the mirror portions 24 in which the microstructures 14 are located is less than the optically transmissive structure 16. The gain region 20 has a relatively high refractive index in comparison with the microstructured mirror portions 24 and as a result optical energy is concentrated in this gain region.

Situating the gain region 20 in the optical cavity 22 forms a laser 26. An optical pump 28 pumps the gain region 20 from beneath the laser 26 in the embodiment shown in FIG. 1. An arrow 30 represents a light beam that pumps the gain region 20. This orientation is referred to as out-of-plane pumping as the pumping is not guided or propagated in-plane along the substantially transmissive structure 16. Instead, the pumping light is injected in a direction perpendicular to the substantially transmissive structure 16, which is shown as comprising a planar slab-like structure in FIG. 1.

As is well know, light output from lasers rapidly increases with a high contrast when the gain medium is pumped above a threshold level. Accordingly, light represented by an arrow 32 is output from an output port 34 of the laser structure 26. In addition, the optical logic device 10 depicted in FIG. 1 includes first and second input ports 36, 38 that receive first and second optical input signals represented by arrows 40, 42.

The optical output of the laser 26 depends on the first and second optical input signals 40, 42. In certain embodiments, for example, the pump 28 pumps the gain region 20 to a level below threshold. Light is therefore not emitted. If, however, the pump power 30 is supplemented by the first and second input signals 40, 42 directed into the first and second input ports 36, 38, the gain region 20 is pumped above threshold and light is emitted from the output port 34. Optical logic may be implemented in this manner.

As described above, in certain embodiments the optical logic devices 10 comprises a nanocavity device. The laser structure 26 comprises a nanocavity laser wherein the optical cavity 24 is an optical nanocavity that supports highly localized optical modes having reduced spatial dimensions. These spatial modes may be in the nanometer range. Nanocavity laser and laser devices are faster and less noisy than larger lasers. Optical cavities 22 having high cavity Q (higher finesse) also permit faster and high contrast (sharper) switching. The cavity Q may range between about 400 to 20,000 for example, about 10,000 in some embodiments although larger or smaller Q values may be used. High contrast optical logic gates may thereby be created.

A cross-sectional view of the logic device 10 is schematically illustrated in FIG. 2. The multiple quantum well structure 16 is depicted as an elongated slab-like medium constructed from the plurality of layers 18a, 18b arranged in a stack. The plurality of layers 18a, 18b may comprises III-V semiconductor material such as for example, InGaAsP material. Other materials such as silicon, diamond, high index oxide, or polymers may be used as well.

As shown, each of the microstructures 14 comprises an air-filled opening in the slab-shaped multiple quantum well structure 16. The size of these microstructures 14 may vary with the specific application. In certain embodiments the size of the holes is between about ⅛ and ½ of the wavelength of operation of the devices 10 and the period of the microstructures is between about ¼ and ¾ wavelength, although values outside these ranges are possible. The absence of the microstructure 14 that creates the defect produces a region between about ¼ to ¾ wavelength across coinciding with the central region 20 described above. This central region 20 need not be in the center of the optical cavity 22. The region may also be larger or smaller.

In some embodiments, for example, the size of the holes is between about 300 nanometers and 500 nanometers and the period is between 400 nanometers and 600 nanometers. The absence of the microstructure 14 that creates the defect produces a region between about 300 nanometers and 600 nanometers across. Values outside these ranges, however, are possible.

The type of microstructures 14 may vary. In one embodiment, the microstructures 14 are holes extending deep into the slab-like structure 16. In other embodiments, these holes may pass through the structure 16. The holes shown are cylindrical, and more specifically, have a shape corresponding to a right circular cylinder. The shape of the microstructures 14, however, is not so limited, rather the microstructures can have other cylindrical and non-cylindrical shapes. For example, other cylindrical shapes having elliptical, square, rectangular, trapezoidal, and triangular, cross-sections are possible. These microstructure 14 may be formed, for example, by etching and may have sloped sidewalls and rounded corners. Accordingly, the microstructures 14 may be less than perfectly shaped and may be irregular.

In still other embodiments, the microstructures 14 may be filled with a material other than air or vacuum. Preferably, this material has an index of refraction substantially different than the substantially transmissive medium 16 in which they are formed. In various other embodiments, the microstructures 14 may be covered over by one or more layers of material.

In the case where the microstructures 14 together form a photonic bandgap crystal, the microstructures can be filled with a material having a higher index of refraction than the optically transmissive structure 16. The effective index of refraction within the effective mirror portion 24 will be subsequently higher than the effective index of refraction within the central region 20. However, the coherent scattering effect provided by the photonic bandgap crystal prevents light having a wavelength within a specific forbidden band from propagating inside and thus through the mirror portions 34. Optical modes can therefore be concentrated to the gain region 20 even though the gain region has a lower effective refractive index than the mirror portions 34.

Since the microstructures 14 comprise a material having a different refractive index than the optically transmissive structure 16, the microstructures will individually reflect and scatter light incident thereon. Preferably, the spacing and specific arrangement of the microstructures 14 provide the appropriate coherent effect to deflect light of the desired wavelength back into the gain region 20. Such photonic crystal band gap structures are well known. The structures disclosed herein, however, need not be limited to conventional photonic crystal band gap structures. Other types of mirrors 14, such as for example concentric rings, concentric spheres, concentric cylinders, may be employed. Mirrors 14 both well known as well as those yet to be devised may be used.

As described above, in some embodiments the gain region 20 is characterized by an effective index of refraction which is higher than an effective index of refraction within the mirror portions 24. For example, the air filled microstructures 14 have a lower index of refraction than does the quantum well structure 16 causing the average and effective index in the mirror portions to be lower than the gain region 20.

The degree to which the indices of refraction of the mirror portion 24 and the gain region 20 differ from one another directly affects the strength of confinement of light within the gain region and thus the spatial extent (i.e., cross-section) the optical modes therein. Higher index contrast, i.e. larger differences between the two indices results in smaller optical modes. Photonic crystal mirrors are particularly effective at providing increased localization and reduced mode sizes. As discussed above, nanocavity lasers, which have reduced size optical cavities and optical modes, can be modulated at increased rates and potentially reduced noise level. Accordingly, nanocavity device designs may offer improved performance.

As described above, the optical mode is concentrated in the gain region 20. The multiple quantum wells in the gain region 20 shown in FIG. 2 are pumped and may emit light as a result of such pumping. Optical energy builds up in the optical cavity 22 and a portion of this optical energy may be released through the output port 34.

One embodiment of the optical logic device 10 that is schematically illustrated in FIG. 3 comprises a quantum dot 44 imbedded in the optically transmissive structure 16 that is not a quantum well structure. This quantum dot 44 may comprise, for example, InGaAs/GaAs materials. Other materials III-V may be employed as well. The optically transmissive medium may comprise, e.g., glass or semiconductor. In another embodiment, for example, the quantum dot 44 may comprise PbS or HgTe and the optically transmissive structure 16 may comprise silicon. Other materials may be employed for the quantum dot 44 as well as for the optically transmissive structure 16.

Other types of quantum dots 44 that may be employed include fluctuation quantum dots and self-assembled quantum dots. Self-assembled quantum dots are generally smaller in volume and offer higher confinement energies. These quantum dots can as a result function at higher temperatures. In other embodiments, light emitting structures other than quantum dots 44 may be disposed in the gain region 20. Examples include but are not limited to a unit cell of a bulk crystal with dopants, a rare-earth atom disposed in a crystal, or a free atom. Small light emitters are particularly suitable for nanocavity devices.

The logic device shown in FIG. 3 also includes electrodes 46 disposed on opposite sides of the gain region for injecting current therethrough. Electronic pumping may thereby be accomplished. Alternatively, the electrodes 46 may be on laterally disposed sides the perforated slab 16 (e.g., on the left and right sides in FIG. 3). A continuous current path is provided by the slab 16 such that the quantum dot 44 can be excited by injecting current laterally through the slab.

Like the quantum well structure, this quantum dot 44 emits light when energized. When pumped above threshold, the laser structure 26 will emit light through the output port 34.

Figure 4:
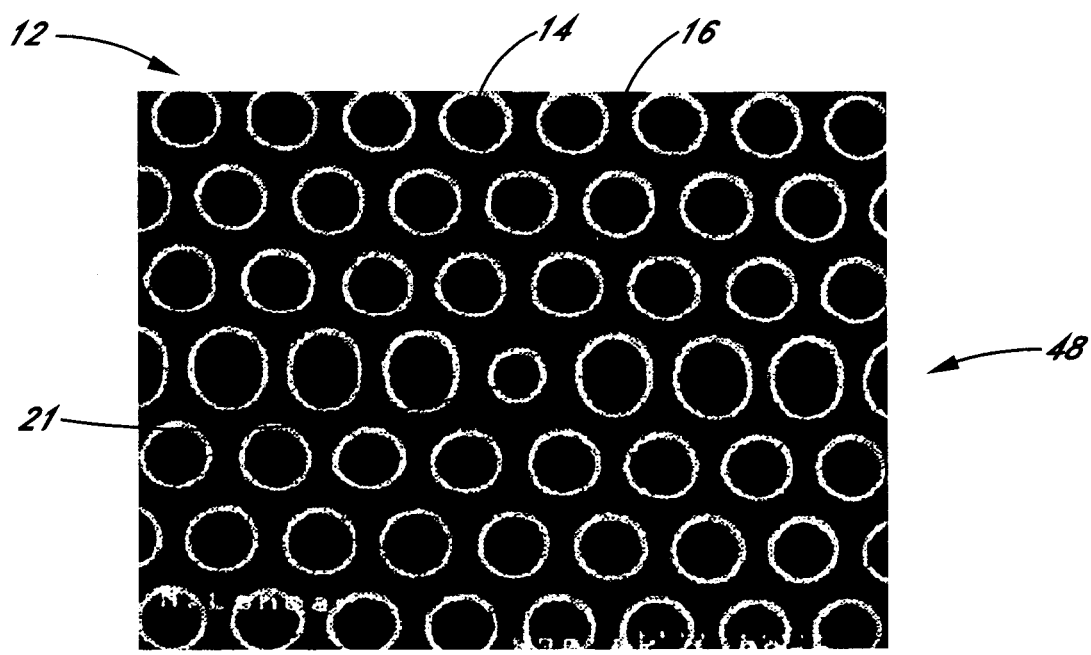
FIG. 4 schematically illustrates an array of microstructures arranged in hexagonally closed-packed structure with a defect comprising a microstructure having reduced size.

The array 12 of microstructures 14 may also have different configurations. In FIG. 4, for example, the microstructures 14 are arranged in a hexagonally closed-packed structure in the optical transmissive medium 16. These microstructures 14 form a photonic crystal nanocavity. In this optical nanocavity, the defect 21 comprises a microstructure 14 with reduced size. The microstructures 14 along a row 48 through the defect 21 are enlarged in comparison with the other microstructures in the array 12. Nevertheless, these microstructures 14 comprise point structures arranged in an ordered array 12. In other embodiments, square arrays and disordered arrays 12 of point structures 14 may be employed. The microstructures 14 can also change size and shape, for example, in the central region 20. Such modifications may be employed to control the laser frequency and quality (Q) and finesse of the cavity 22.

Although the defect 21 comprises a microstructure 14 having reduced size, the defect may be formed by a microstructure 14 having increased size, and light will be localized in the optical cavity. More generally, the defect 21 is created by a perturbation in the array, which may be a photonic crystal. This perturbation causes the localization of the light.

Figure 5:
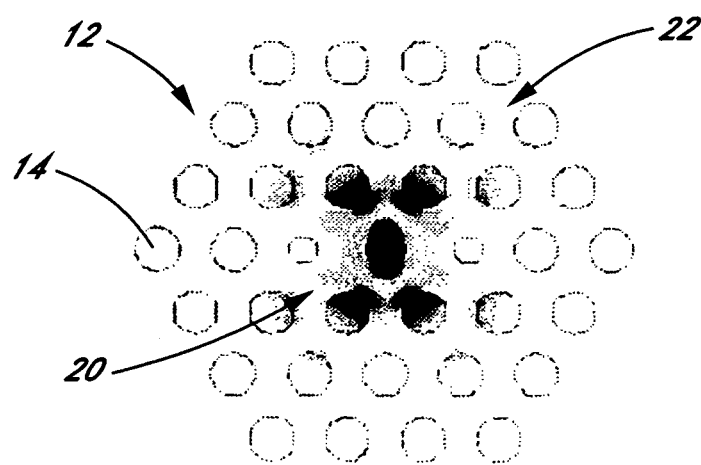
FIG. 5 schematically illustrates an electric field distribution in the hexagonally closed-packed structure depicted in FIG. 4.
Figure 6:
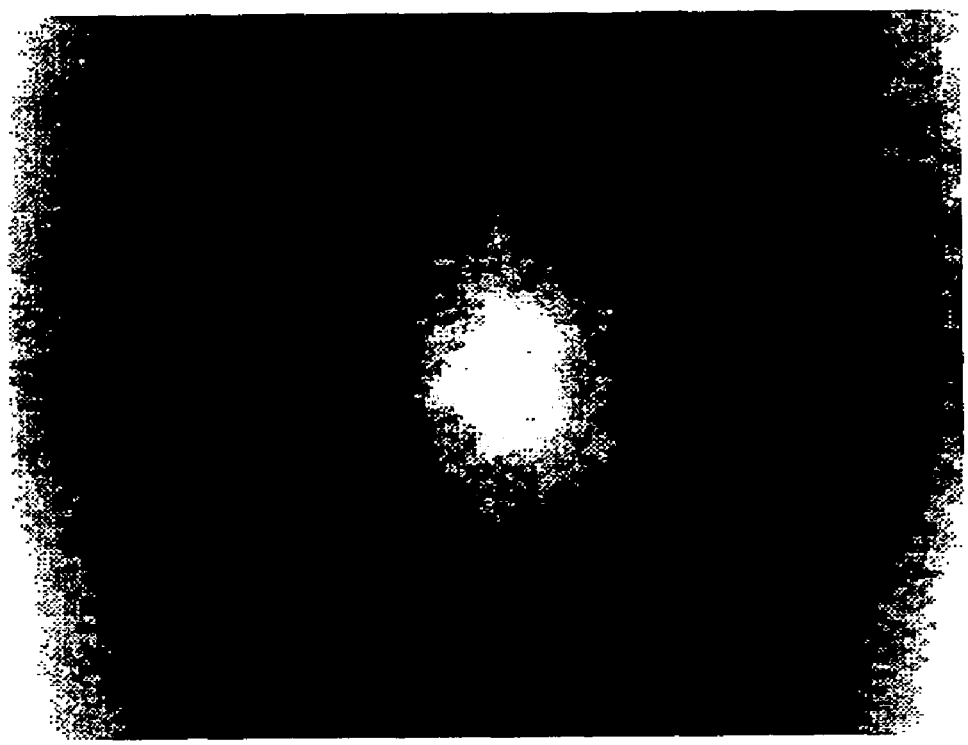
FIG. 6 schematically illustrates an optical intensity distribution for the hexagonally closed-packed structure depicted in FIG. 4.

FIG. 5 schematically illustrates an optical field distribution in the optical nanocavity 22 based on modeling and simulating the hexagonally closed-packed array shown in FIG. 4. The electric field is concentrated in the gain region 20 of the optical nanocavity 22 where the defect 21 is located. FIG. 6 is a near-field optical micrograph showing the distribution of optical energy measured in the optical nanocavity 22. The optical energy is concentrated in a region 20 less than about two micrometers in this photonic crystal nanocavity.

Figure 7:
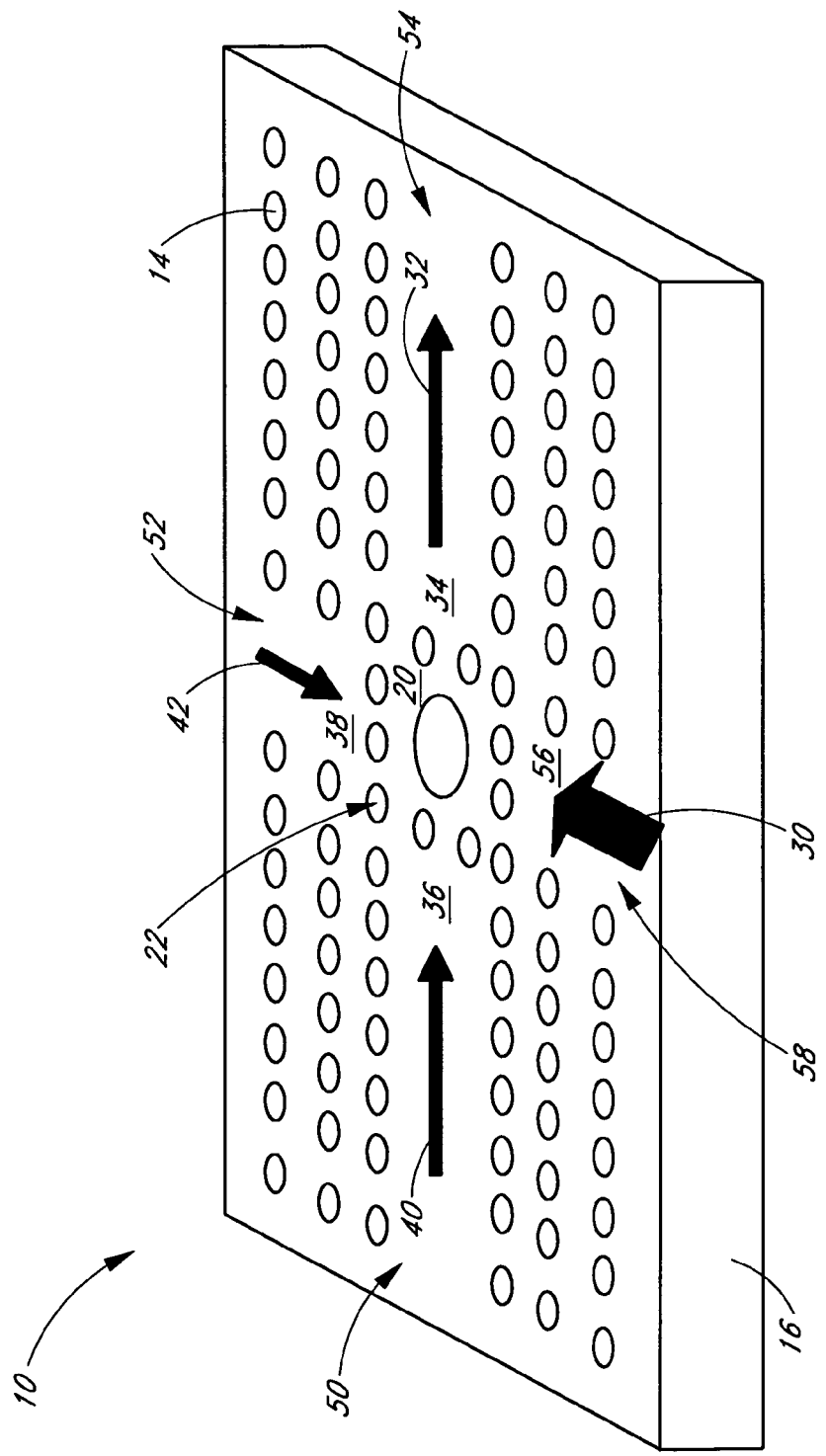
FIG. 7 is a schematic drawing of an embodiment of the optical logic device showing microstructure-doped waveguide structures for coupling light into and out of the optical cavity.

The optical output 32 as well as the first and second optical input signals 40, 42 may be coupled out of or into the optical cavity 22 via waveguide structures. In the device 10 schematically illustrated in FIG. 7, the optical first and second optical input ports 36, 38 comprise first and second waveguides portions 50, 52. The optical output port 34 also comprises a waveguide portion 54. The device 10 further comprises a pump port 56 for receiving pump radiation 30. This pump port 56 too comprises a waveguide portion 58. In the embodiment depicted in FIG. 7, these waveguide structures 50, 52, 54, 58 are microstructure-doped waveguides that may comprise photonic crystal. In other embodiments, the microstructure-doped waveguides 50, 52, 54, 58 are not photonic crystals. Other types of waveguides including but not limited to channel waveguides, rib or ridge waveguides, and strip-loaded waveguides may be employed.

The first and second optical input signal 40, 42 as well as pump power 30 propagate within the optically transmissive structure 16 within the respective waveguide portions 50, 52, 54 into the optical cavity 22 and to the gain region 20. Emission from gain region 20 is output from the optical cavity 22 and propagates within the optically transmissive structure 16 through the waveguide portion 54 for the output port 34. The first and second optical inputs 36, 38, the pump 56, and the output 34 are referred to as in-plane as the input signals 40, 42, the pump beam 30, and the output signal 32 are propagated within and along the optically transmissive structure 16. Vertical confinement may be provided by the optically transmissive structure 16 which has a higher index of refraction than a surrounding medium such that the light is guided within the optically transmissive structure.

An exemplary process for forming the optical logic device 10 is depicted in FIGS. 8A-8I. FIG. 8A schematically illustrates an InP substrate 60 having InGaAs etch stop layer 62 formed thereon. An InP sacrificial layer 64 is formed on the etch stop 62. A multilayer InGaAsP slab 66 with four quantum wells is disposed on the InP sacrificial layer 64. This multilayer InGaAsP slab 66 may be formed by MOCVD in some embodiments although other processes may be employed.

This multilayer slab 66 may comprise more or less quantum wells. Similarly, other materials may be employed. For example, an alternative exemplary embodiment, a multilayer structure 66 that comprises GaAs/AlGaAs quantum wells is formed on AlAs. (The InP is replaced by the AlAs, and the InGaAsP is replaced by the GaAs/AlGaAs layers.) In another embodiment, an InAs/GaAs multilayer structure 66 is formed on AlAs. (The InP is replaced by the AlAs, and the InGaAsP is replaced by InAs/GaAs.) In a different embodiment, a silicon structure 66 is formed on silicon dioxide. (The InP is replaced by the silicon dioxide and the InGaAsP is replaced by silicon.)

A silicon nitride (Si$_3$N$_4$) layer 68 is formed on the multilayer InGaAsP slab 66 as shown in FIG. 8B and a gold film 70 is formed on the silicon nitride layer 68 as illustrated in FIG. 8C. A PMMA layer 72 is formed on the gold film 70 as shown in FIG. 8D. This PMMA layer 72 is patterned as illustrated in FIG. 8E. This pattern corresponds to the arrangement of microstructures 14 in the array 12 of microstructure and can be ordered or disordered. The pattern also accounts for the gain region 20 by excluding the formation of a microstructure 12 in that region. (In other embodiments, the central region 22 may be etched for example to provide an opening as the defect 21. A gain structure such as a quantum dot 44 may be inserted that opening.)

As illustrated in FIGS. 8F, 8G, and 8H, the pattern is propagated through the gold film 70, the silicon nitride layer 68 and into the InGaAsP slab 66. In this embodiment, holes corresponding to the microstructure 12 are etched through the InGaAsP slab 66 to the InP sacrificial layer 64 immediately beneath. A portion of the InP sacrificial layer below the array 12 of microstructures 14 is removed using a sacrificial etch as illustrated in FIG. 8I. An open area 74 is thereby formed in the InP sacrificial layer 64 immediately beneath the array 12 of microstructures 14. Lower refractive index in this open area 74 as well as possibly above the InGaAsP slab 66 provides for vertical confinement of optical energy within the InGaAsP slab by total internal reflection. As discussed above, the optical cavity 22 provides lateral confinement of optical modes in the gain region 20.

In certain embodiments, microstructures 14 are also formed to create microstructure-doped waveguide portions 50, 52, 54 as inputs 36, 38 and outputs 34 to the laser structure. Conventional waveguides such as channel, rib or ridge, or strip-loaded waveguides may be fabricated as well.

Other processes and other materials may be employed. For example, quantum dots 44 may be embedded in the central region slab 66 as described above. These quantum dots 44 may be formed, for example, by molecular beam epitaxy (MBE). The position of the quantum dots may controlled by performing selective growth on masked substrates although other methods may be employed.

Figure 9:
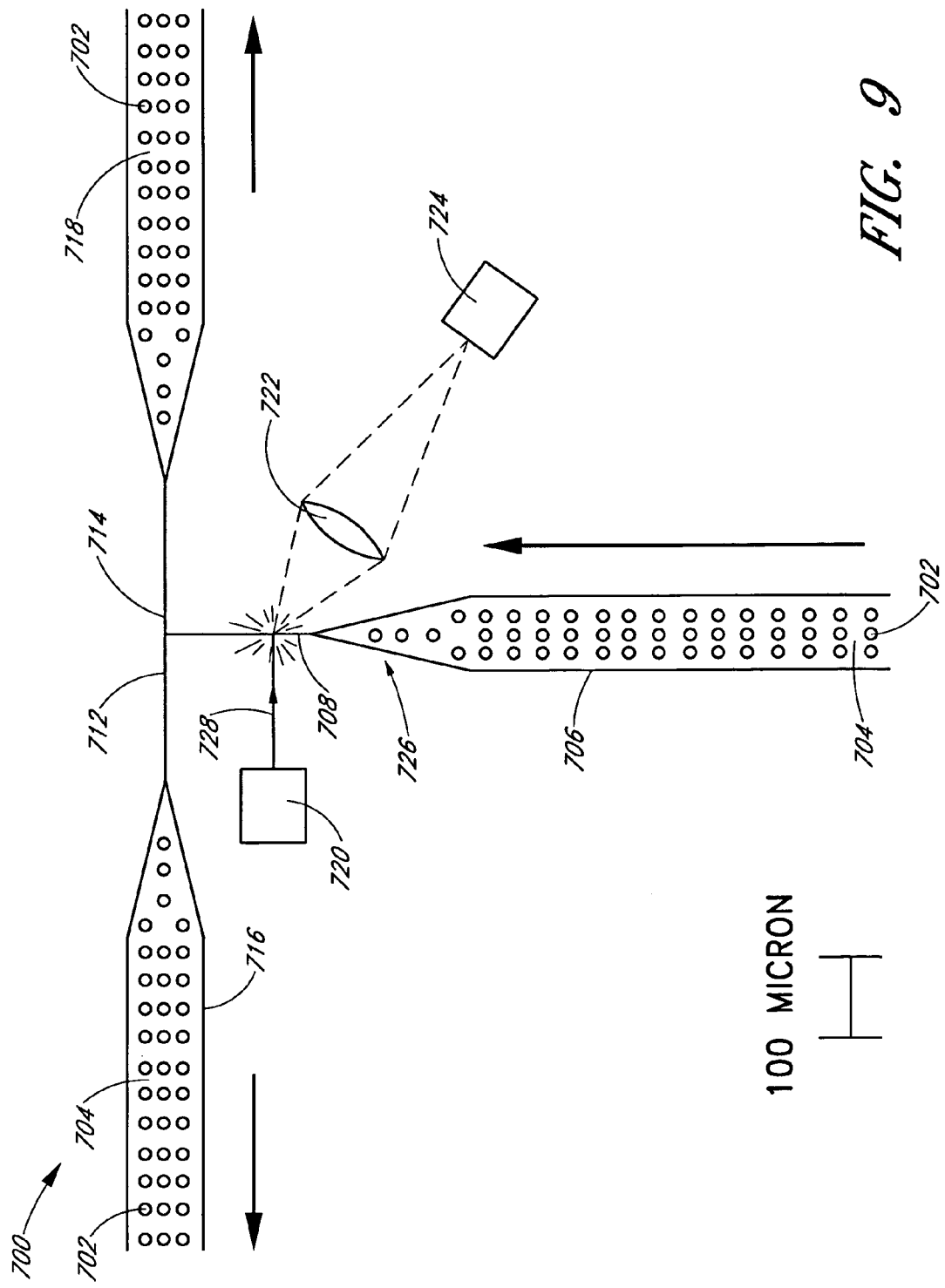
FIG. 9 schematically illustrates a microfluidic analysis system for sorting small light emitters suspended in a fluid.

Small structures such as quantum dots or fluorescent beads may be individually selected, e.g., to match the wavelength of a mode supported by the optical cavity 24 and may be inserted in the gain region 20. FIG. 9 schematically illustrates a microfluidic analysis system 700 for sorting small light emitters 702 suspended in a fluid 704. The system 700 includes an input flow channel 706, an observation channel 708, and a sorting region 100. The sorting region 100 includes first and second valves 712, 714 as well as first and second output flow channels 716, 718.

The input flow channel 706 is connected to the observation channel 708 which has smaller dimensions. The observation channel 708 is connected to the first and second valves 712, 714 each of which may be open or closed. The first and second output flow channels 716, 718 are connected to the first and second valves 712, 714, respectively. Opening the first valve 712 provides a path from the observation channel 708 to the first flow channel 716. Opening the second valve 714 provides a path from the observation channel 708 to the second flow channel 718.

The input flow channel 702 may be connected to a source or reservoir (not shown) containing fluid with many small light emitters therein. A pump (also not shown) may be connected to the input flow channel 706 and the reservoir. The fluid can also be designed to flow through surface tension if the walls of the flow channel are hydro-philic, or by electro-osmotic pumping. The system 700 may further comprise a light source 720, as well as collection optics 722 and a detection system 724, disposed with respect to the observation channel 708.

This microfluidic analysis system 700 may operate similar to a Fluorescence Activated Cell Sorter (FACS). Light emitters 702 from the reservoir are passed through the input flow channel 706 into the observation channel 708 to be processed. The pump facilitates flow of the light emitters 702. A neck portion 726 of the input channel 726 together with the reduced dimension of the observation channel 708 permits individual light emitters 702 to be isolated for study in the observation channel.

Light emitters 702 may be sorted, for example, based on the wavelength of light emitted in response to illumination from the light source 720. As shown in FIG. 9, an excitation beam 728 incident on one of the light emitters 702 causes the light emitter to radiate light at a particular wavelength. This wavelength may depend on properties of the light emitter 702 such as size and composition. The radiation emitted from the light emitter 702 is collected by the collection optics 722 and can be used to identify the type of emitter. The light emitter 702 is directed into either the first or second output channel 716, 718 by properly setting the first and second valves 712, 714.

The first and second output channels 716, 718 may continue onto additional channels similar to those shown in FIG. 9 for further screening or to other destinations. Screening may be based on wavelength and/or other optical or non-optical properties. Other variations of the sorting system 700 and methodology are also possible.

Figure 10:
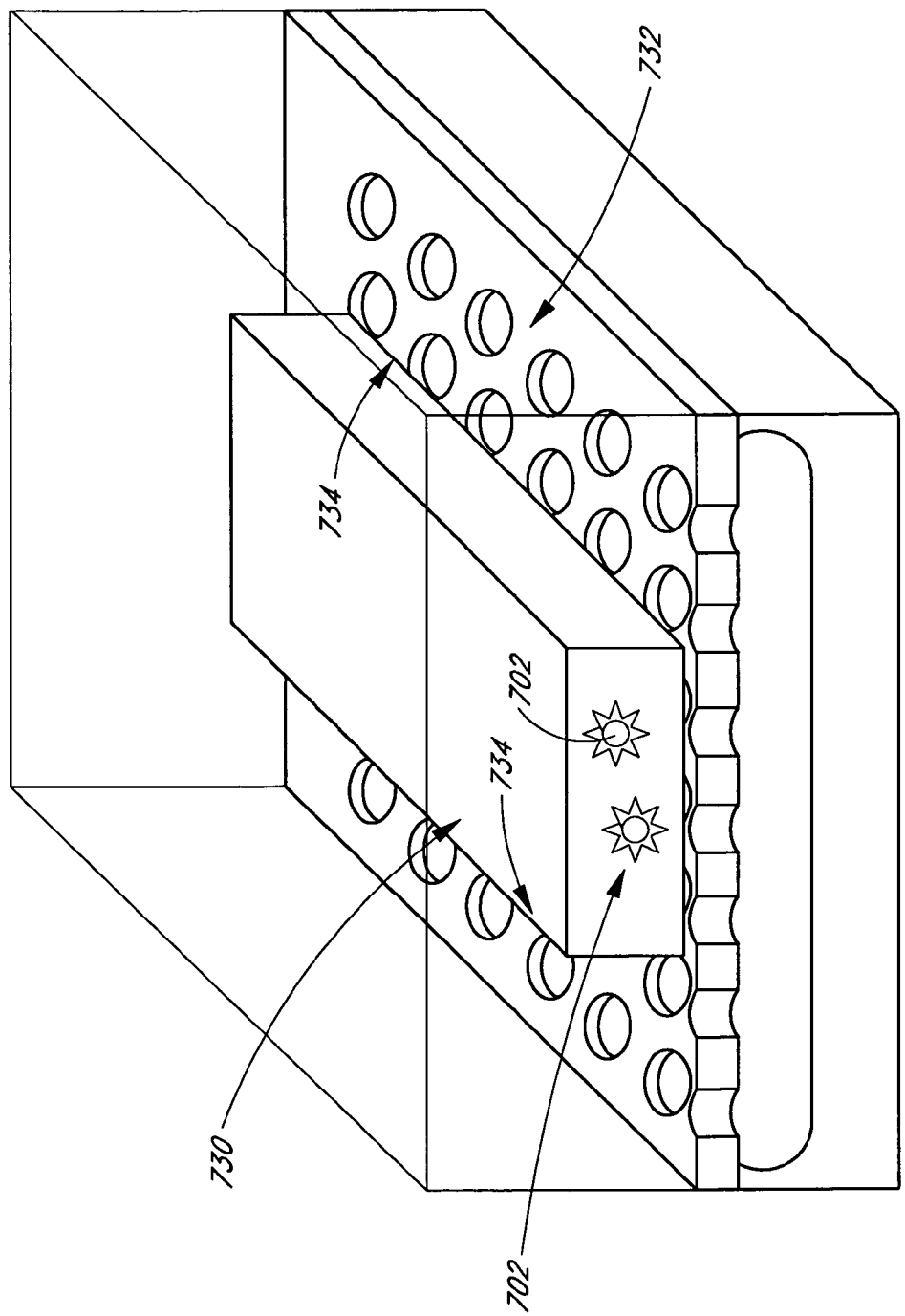
FIG. 10 schematically illustrates microfluidic delivery of light emitters to a microstructure-doped optical cavity.
Figure 11:
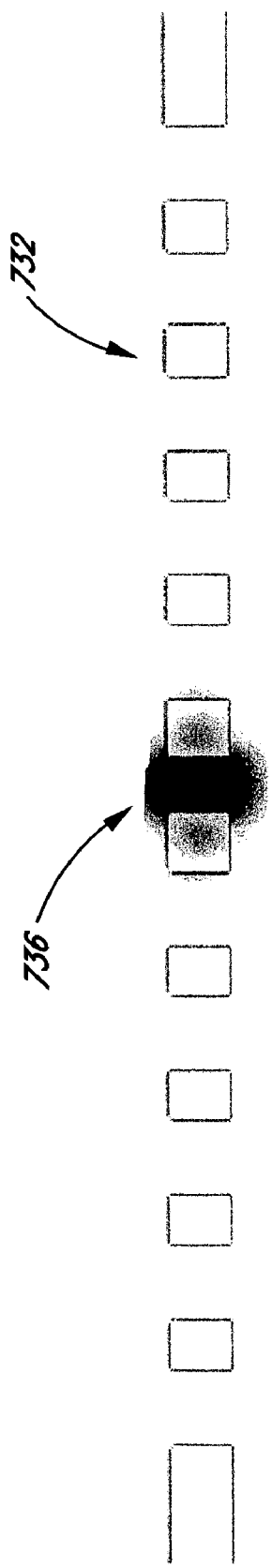
FIG. 11 schematically illustrates a concentrated optical field in a region of the optical cavity that traps a light emitter.

In certain embodiments, the light emitters 702 are flowed into a flow channel 730 disposed above a microstructure-doped optical cavity 732 formed by opposing microstructure-doped mirrors portions 734 as shown in FIG. 10. Optical tweezing can be used to appropriately position the light emitter 702 in the optical cavity 732. The light emitter 702, which preferably has a higher index of refraction than that of the surrounding medium, is drawn into a central region 736 of the optical cavity 732 where optical intensity is concentrated as illustrated in FIG. 11. The light emitter 702 may be optically trapped in this central region 736. Advantageously, the light emitter 702 may be situated at the location 736 of a strong optical mode supported by the optical cavity 732. The light emitter 702 will provide gain for the resonant cavity 732.

The light emitter 702 may comprise a bead or quantum dot that is sorted as described above. Exemplary beads may have a lateral dimension of about 60 nanometers although the beads may be larger or smaller. Other structures may also be used as light emitters 702. Examples of structures that may be employed include but are not limited to fluctuation quantum dots, self-assembled quantum dots, a unit cell of bulk crystal, a rare-earth in a crystal, free atoms or luminescent molecules. Exemplary quantum dots include colloidally suspended HgTe, PbS, CdSe or CdS, which may be microfluidically delivered to silicon on insulator nanocavities.

Both active and passive cavities 732 may produce the field for optical trapping. For example, in one embodiment, the optical trapping field is generated by gain from the quantum wells comprising the microstructure-doped photonic crystal mirrors 734. Current injected into the quantum wells may produce a localized optical intensity distribution in the optical cavity 732. This type of cavity 732 is referred to herein as an active cavity. In another embodiment, the optical trapping field is provided by an external input light source matched to the frequency of one of the cavity modes. Light from this external source is injected into the cavity 732 to provide the concentrated optical field. A silicon on insulator medium is an example of such a passive cavity 732.

As described above other techniques may be employed to fabrication the laser structures and optical logic devices 10.

Figure 12B:
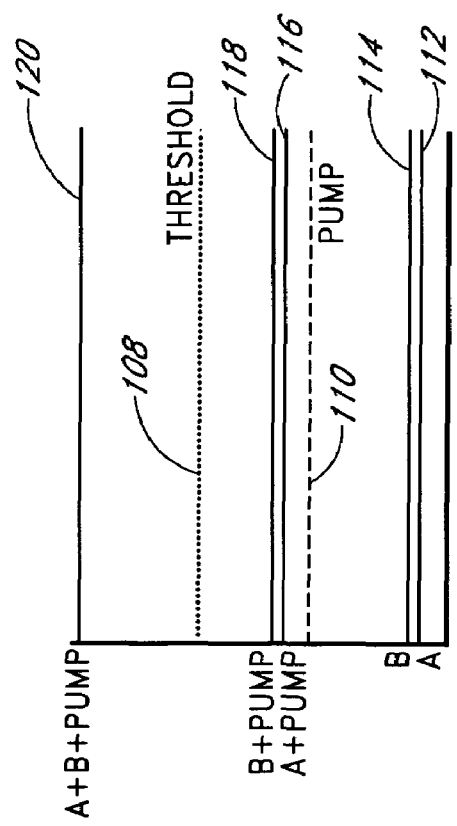
FIGS. 12A and 12B schematically illustrate an AND gate and implementation of the AND operation using the optical logic device.
Figure 12A:
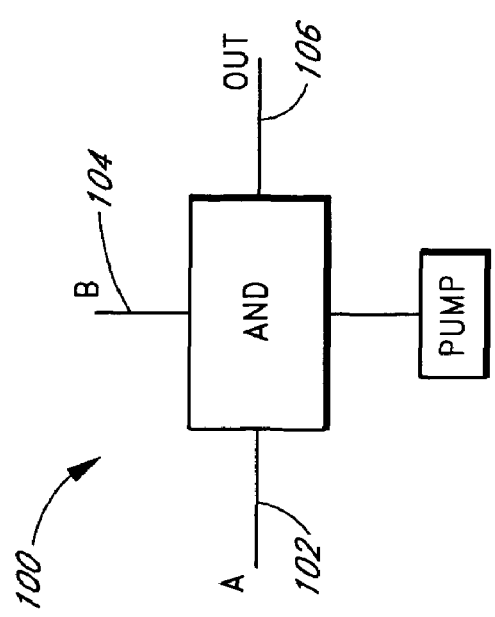

The optical logic device 10 described above may be used as an AND gate 100 such as shown in FIG. 12A. The AND gate 100 has first and second inputs 102, 104 and an output 106. A signal is output from the AND gate 100 only when signals are received by both the first and second inputs 102, 104.

To implement this logical operation using the optical logic device 10 described above, pumping may be sufficiently below threshold that lasing occurs upon introduction of both first and second signals into the optical cavity 22 and not with solely the first input signal or solely the second input signal. FIG. 12B illustrates this concept graphically. FIG. 12B schematically shows the threshold level of power 108 which causes the laser 26 to lase and output to be emitted from the optical logic device 10. FIG. 12B also schematically illustrates the pump power level 110 as well as the first and second input signal levels 112, 114. Each of these signals power levels 112, 114 are less than the threshold level 108. Moreover, the combination of the first input and the pump (represented by level 116) is also less than the threshold 108 for lasing. Similarly, the sum of the second input and the pump (represented by level 118) is less than the threshold 108. The combination of the first and second inputs together with the pump (represented by level 120), however, is larger than threshold 108 such that the laser 26 lases upon introduction of both the first and second optical input signals while the laser 26 is being pumped.

Figure 13B:
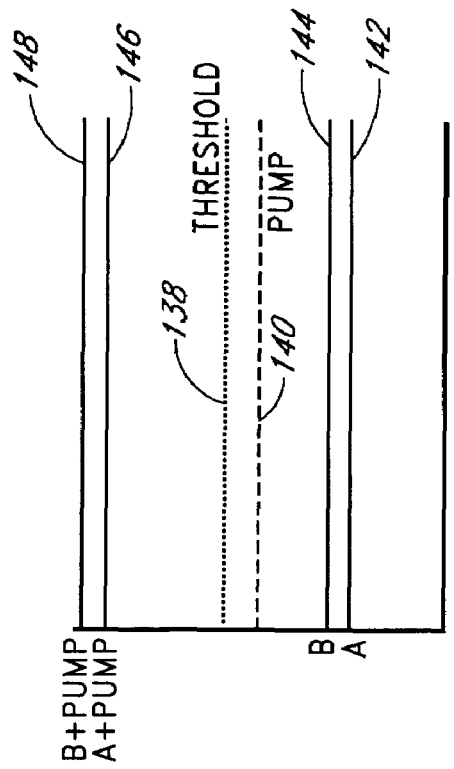
FIGS. 13A and 13B schematically illustrate an OR gate and implementation of the OR operation using the optical logic device.
Figure 13A:
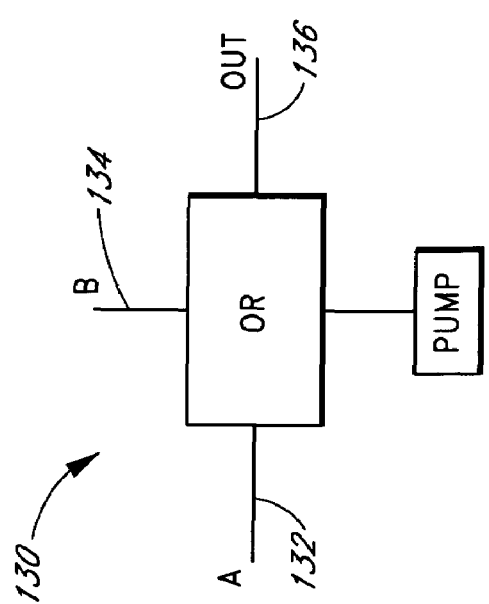

The optical logic device 10 may also be used as an OR gate 130 such as shown in FIG. 13A. The OR gate 130 also includes first and second inputs 132, 134 and an output 136. A signal is output from the OR gate 130 when signals are received by either the first and second inputs 132, 134.

To implement this logical operation using the optical logic device 10 described above, pumping may be below but relatively close to threshold such that lasing occurs upon introduction of either first and second signals into the optical cavity 22. FIG. 13B illustrates this concept graphically. FIG. 13B schematically shows the threshold level 138, as well the pump power level 140 and the first and second input signals level 142, 144. Although the pump level 140 is below threshold 138, the first input signal together with the pump (represented by level 146) and the second input signal together with the pump (represented by level 148) are above threshold 138.

Advantageously, the nonlinear intensity response in lasers as a result of lasing threshold characteristics provides high contrast for these gates 100, 130. Additionally, the logical device 10 can be reconfigured to operate as an AND or an OR gate depending on the level of pumping. The lower level of pumping can be used to implement the AND operation while the higher level of pumping may be used implement the OR function. Other designs are possible. For example, the AND and OR gates 100, 130 may comprise more inputs than the first and second inputs 102, 104, 132, 134 and the more than one output 106, 136. For example, three or more inputs may be ANDed together and the AND gate 100 may have two or more output.

Figure 14:
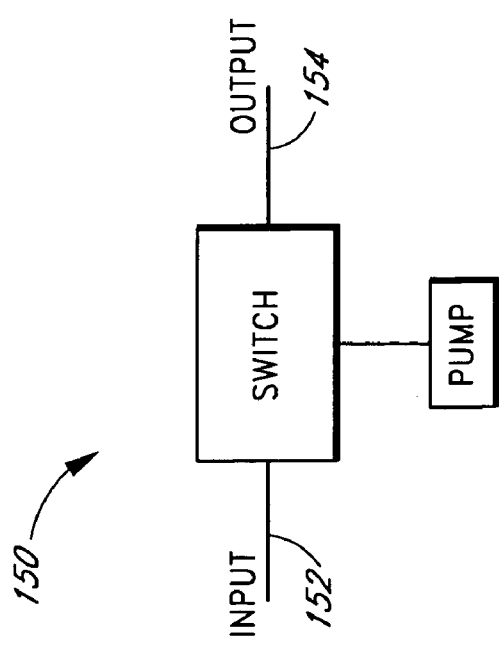
FIG. 14 schematically illustrates a switch for switching an output on and off or for switching the wavelength of the output based on an input to the switch.

The optical logic device 10 may also be used as an optical switch 150 such as shown in FIG. 14. The switch 150 includes a signal input 152 and an output 154. In one embodiment, the switch 150 produces an output signal when a signal is applied to the input 152.

To implement this switching operation using the optical logic device 10 described above, the optical cavity 22 is pumped so as to produce light emission from the emitter in the gain region 20. The optical cavity 22, however, is not tuned to the wavelength of emission such that an optical resonance is not achieved and output is not obtained for that wavelength. Introduction of light into the input 152 may, however, through nonlinear effects such as carrier-induced changes cause an index of refraction variation in the optical cavity 22. This index variation tunes the cavity 22 to the frequency of light emitted by the light emitter in the gain region 20. Optical resonance and optical output from the laser device 26 will be obtained.

Conversely, the optical cavity 22 may be tuned to the wavelength of emission of the light emitter in the gain region 20 such that an optical resonance is achieved and output is obtained for that wavelength. Introduction of light into the input 152 may, however, through nonlinear effects cause an index of refraction variation in the optical cavity 22 that detunes the cavity away from frequency of light emitted by the light emitter in the gain region 20. Optical output from the laser 26 would cease.

In other embodiments, inducing index of refraction variation may suppress or change the spatial extent or polarization of an optical mode otherwise supported by the optical cavity thereby attenuating output without necessarily altering the resonant frequency of the optical resonator 22. The relative Qs of the modes in a laser cavity 22 can be changed by selectively altering the losses in these modes through the optical or electronic injection of excess carriers. Addition or subtraction of such carriers can contribute to transparency and reduce absorption losses, or can modify the refractive index of the mirrors encountered by light in the competing modes. Q-switching between one lasing mode and another mode may be accomplished in this manner and may yield even faster switching responses.

In one embodiment, for example, the optical switch 100 comprises a cavity that supports two competing modes. The first mode has a first polarization and the second mode has a second polarization. The relative loss of these two modes may be altered by applying a signal to the inputs 102, 104 as described above. The polarization of the output of the switch 100 will vary depending on which mode dominates. The output may thus be switched between polarizations. In some embodiments, a polarizer or other polarization sensitive component is included with the optical cavity 22. The output of the switch 100 may thus be turned on or off.

As illustrated above, this switch 150 may be configured to operate as a NOT gate. An optical signal is output from the switch 150 when no optical signal is applied to the input 152. However, when an optical signal is introduced to the input 152, the output of the switch is null. In the polarization-based switch 100 described above, a NOT gate is obtained by selecting the polarizer to block the polarization output when the input is applied.

In an alternate related embodiment, the optical cavity 22 is tuned to a first wavelength when no light is introduced into the input 152 and is tuned to a second wavelength when light is introduced into the input. Light emission produced by pumping the gain region 20, however, includes both the first and second wavelengths. The switch 150 will therefore output light having the first wavelength or light having the second wavelength depending whether a signal is applied to the input 152.

High cavity Q's and high finesses increase contrast in these switches 150. Use of optical nanocavities may further enhance the performance. A reduction in the cavity volume limits the number of modes and thereby yields faster switching, as the efficiency of the coupling of spontaneously emitted light into the modes supported is increased. For example, the spontaneous emission rate into a certain mode from an emitter in a cavity may be proportional to Q/V where Q is the quality factor of the cavity and V is the volume of the cavity.

Figure 15:
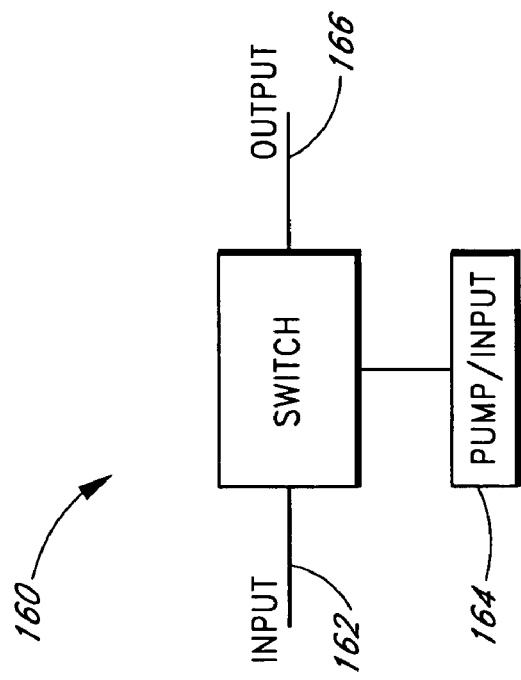
FIG. 15 schematically illustrates a switch for controlling passage of an input signal through the switch based on whether a pump signal is introduced into the optical cavity.

In other embodiments, the optical pump is used as an input to control the output. See, for example, FIG. 15. This switch 160 includes a signal input 162, a pump/input 164, and an output 166. A signal applied to the signal input 162 is output from the switch 160 when the optical cavity 22 is sufficiently pumped.

Figure 16A:
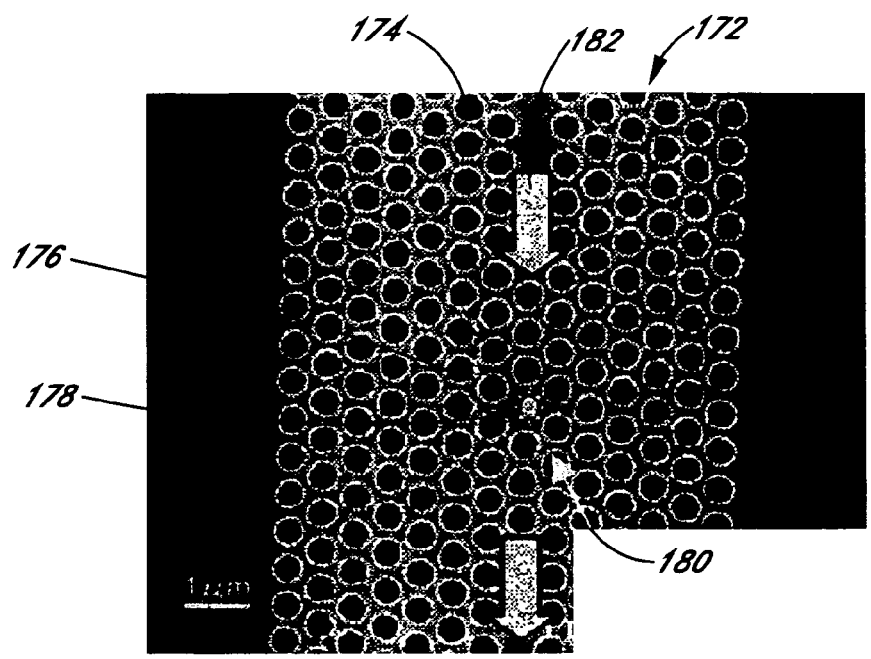
FIGS. 16A and 16B schematically illustrate the operation of the switch shown in FIG. 15.
Figure 16B:
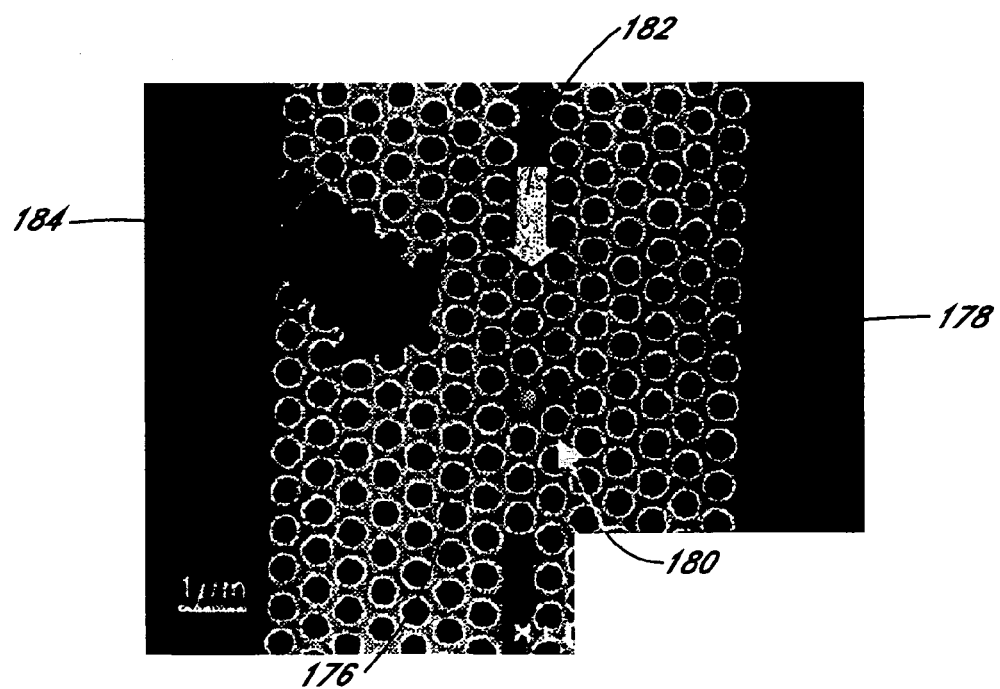

FIGS. 16A and 16B schematically illustrate how the pump 164 prevents the signal input into the switch 160 from being output by the switch. FIG. 16A shows an array 172 of microstructures 174 forming an optical cavity 176 and a gain region 178 in the optical cavity that includes a quantum dot 180 therein. An optical signal (represented by an arrow 182) that does not excite the quantum dot 180 is input into the optical cavity 176. This optical signal 182 may, for example, have a wavelength shorter than any optical transition in the quantum dot 180. The quantum dot 180 remains in the ground state. In this embodiment, the optical cavity 176 is tuned to the wavelength of the optical signal 182, and thus, the optical signal passes though the optical cavity 176 which acts as a Fabry-Perot filter.

Introducing a pump beam (represented by an arrow 184) into the optical cavity 176 excites the quantum dot 180 as shown in FIG. 16B. In this embodiment, the pump beam 184 has wavelength at least as large as an optical transition of the quantum dot 180. Exciting the quantum dot 180 induces an index of refraction variation in the optical cavity 176 and thereby detunes the cavity away from the wavelength of the input signal 182. The input signal 182 is thus not transmitted through the optical cavity 176 and not output from the switch 160.

The pump 164 may be employed as an input to actively control whether the switch 160 is on or off. In certain embodiments, for example, the pump signal 184 may itself be controlled by logic components to implement more complex logic operations.

Figure 17A:
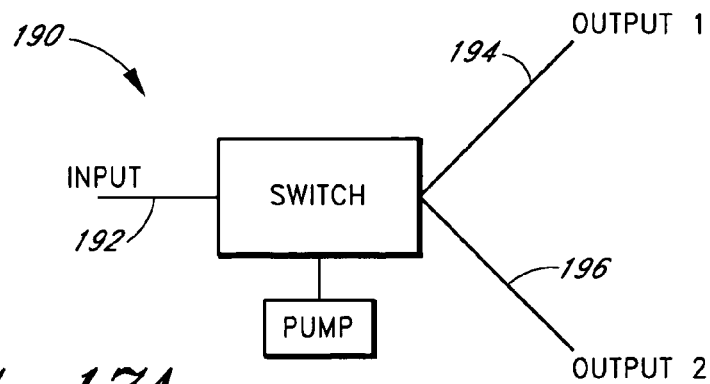
FIGS. 17A and 17B schematically illustrate a switch for switching the spatial direction of an input signal.

Another type of switch 190 is depicted in FIG. 17A. This switch 190 includes a signal input 192 as well as first and second outputs 194, 196. Light is output from either of the first and second outputs 194, 196 depending on whether a signal is applied at the input of the switch 190.

Figure 17B:
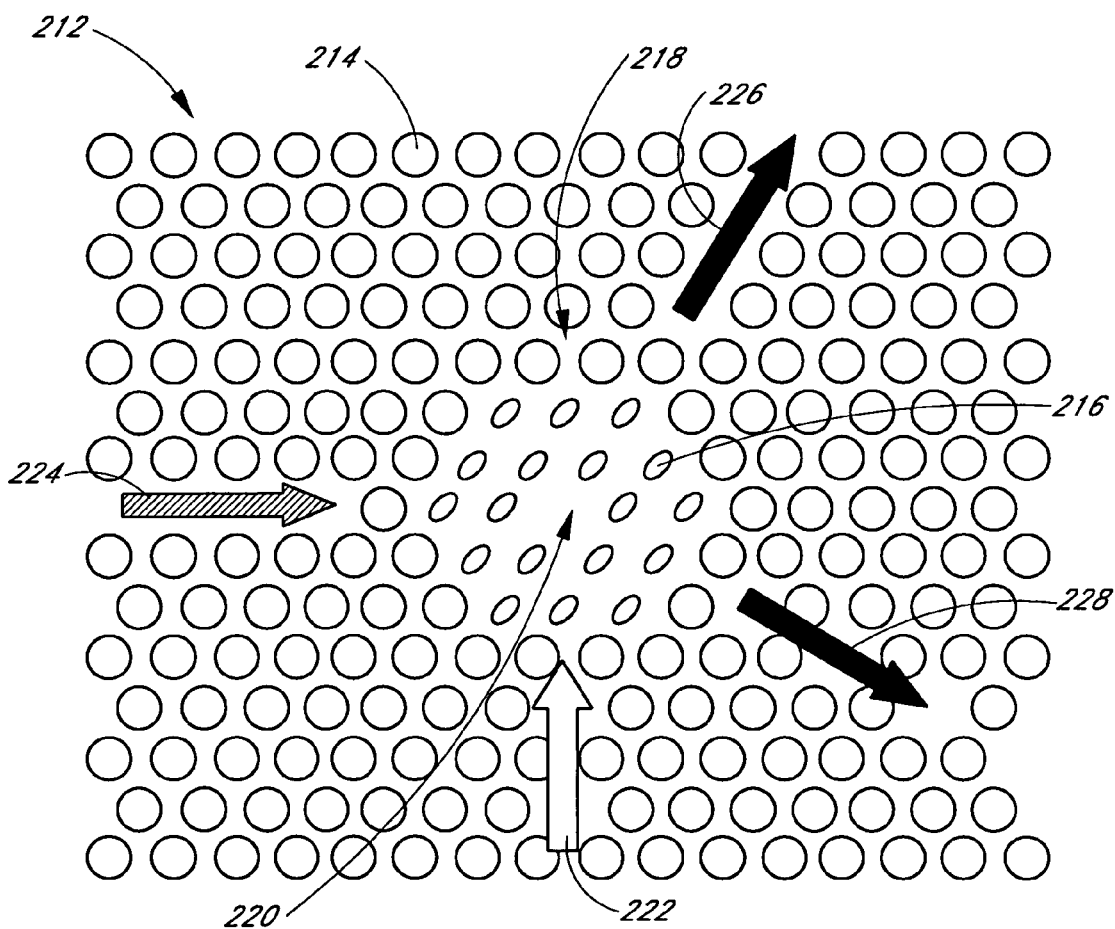

Asymmetry in an array 212 of microstructures 214 such as shown in FIG. 17B produces first and second optical modes that propagate in different direction. In this embodiment, the asymmetry is established by a plurality of elongated microstructures 216 in an optical cavity 218 at or near a gain region 220 therein. The gain region 220 is pumped with pump energy (represented by an arrow 222) providing optical energy within the optical cavity 218. Without application of an input signal (represented by an arrow 224), the optical energy is in the first optical mode which dominates. Introducing the input signal 224 into the optical cavity causes refractive index variation altering the optical properties of the cavity 218. The optical cavity 218 preferentially supports the second optical mode over the first optical mode. The first optical mode which propagates in a first direction (represented by an arrow 226) through the first output 194 is suppressed while the second optical mode which propagates in a second direction (represented by an arrow 228) through the second output 196 is enhanced.

This switch 190 may also be employed as a NOT gate. For example, light emerges from the first output 194 when no optical signal is applied to the input 192. Conversely, the first output 194 is null when an optical signal introduced into the input 192.

Figure 20:
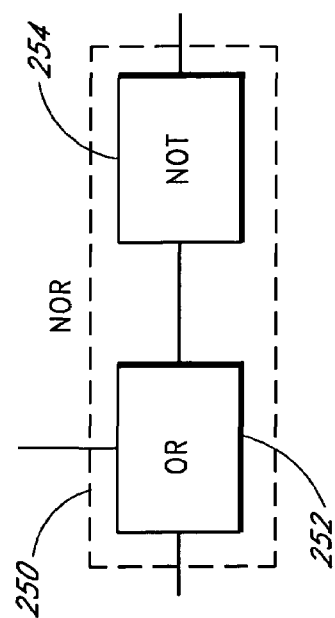
FIG. 20 schematically illustrates a NOR gate.

A schematic illustration of a NOT gate 230 is depicted in FIG. 18. An optical NAND gate 240 may be formed by coupling the output of an optical AND gate 242 with the input of an optical NOT gate 244 as shown in FIG. 19. Similarly, an optical NOR gate 250 may be formed by coupling the output of an optical OR gate 252 with the input of an optical NOT gate 254 as shown in FIG. 20.

An optical flip flop 600 can also be constructed by employing the optical logic devices described above as shown in FIG. 21. The flip-flop 600 may be formed, for example, from first and second NOR gates 610, 620 each comprising an OR gate 602 followed by a NOT gate 604. The first NOR gate 610 has first and second inputs 612a, 612b and an output 614. Similarly, the second NOR gate 620 has a first and second inputs 622a, 622b and an output 624. The second input 612b of the first NOT gate 610 is optically connected to the output 624 of the second NOR gate 620. Similarly, the second input 622b of the second NOT gate 620 is optically connected to the output 614 of the first NOR gate 610.

Figure 21:
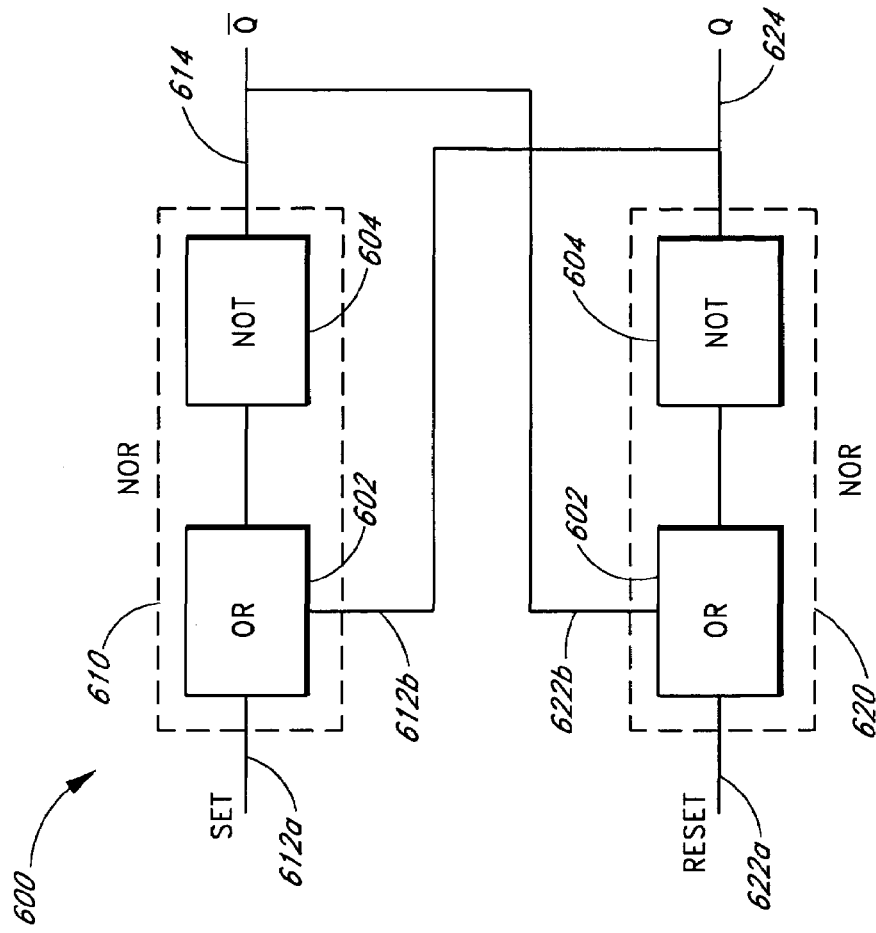
FIG. 21 schematically illustrates a flip-flop.

In FIG. 21, the inputs 612a, 622a to the first and second NOR gates 610, 620 corresponds to SET and RESET of the flip-flop 600, respectively. The outputs 614, 624 of the first and second NOR gates 610, 620 correspond to $\overline{Q}$ and Q. As with conventional flip-flops, when a signal is applied to SET the flip-flop, Q and $\overline{Q}$ are high (1) and low (0) respectively. Even after the SET signal is removed such that the SET is 0, Q and $\overline{Q}$ remain 1 and 0. The flip-flop 600 thus has memory. Also as with conventional flip-flops, when a signal is applied to RESET the flip-flop, Q and $\overline{Q}$ are switched to low (0) and high (1) respectively. Even after the RESET signal is removed such that the RESET is 0, Q and $\overline{Q}$ remain 0 and 1, respectively.

The optical flip-flop 600, however, is fabricated using laser devices such as described herein, and the inputs 612a, 622a as well as the outputs 614 and 624 are optical. The connection between the inputs 612b, 612a and the outputs 614 and 624 are also optical. These optical connections may be implemented by using waveguides such as microstructure-doped waveguides (e.g., within the photonic crystal) or conventional waveguides (e.g., channel, rib or ridge, or strip loaded waveguides). Other approaches may be employed to form the optical connection. The OR and NOT gates 602, 604 comprise microstructure-doped laser structures. Nanocavity laser structures offer increased switching rates, high contrast, and reduced noise, all of which are desirable in a single-bit optical storage element. Although the flip-flop 600 is optical, the flip-flop provides memory. The flip-flop 600 may thus be used as a buffer or memory device. Other configurations and designs, however, are also possible.

Figure 22B:
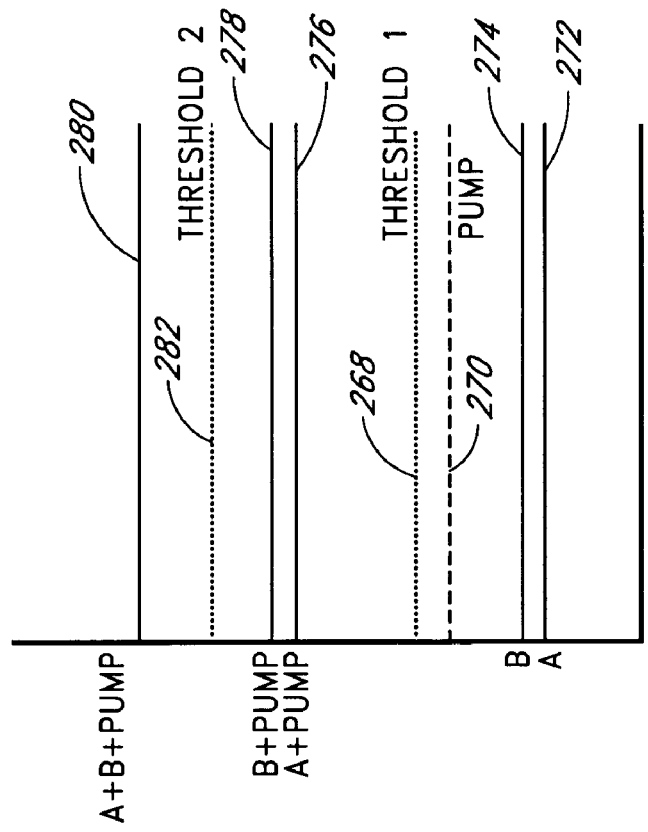
FIGS. 22A and 22B schematically illustrate an XOR gate and implementation of the XOR operation using the optical logic device.
Figure 22A:
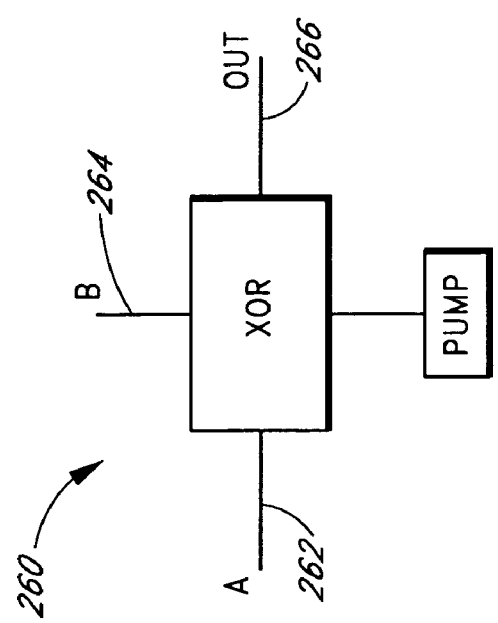

The optical logic device 10 may also be used as an XOR gate 260 such as shown in FIG. 22A. The XOR gate 260 includes first and second inputs 262, 264 and the output 266. A signal is output from the XOR gate 260 when a signal is received by solely the first input 262 or by solely the second input 264 but not when signals are received at both the first and second inputs.

To implement this logical operation using the laser-based optical logic device described above, the pump power introduced into the gain region 20 is below but relatively close to threshold such that lasing occurs upon introduction of either first and second signals into the gain region. This threshold is identified as Threshold 1 (268) in FIG. 22B, which illustrates this concept graphically. FIG. 22B also schematically illustrates the pump power level 270 as well as the first and second input signal levels 272, 274. Although the pump level 270 is below the threshold 268 for lasing, the combination of the first input and the pump (represented by level 276) is above threshold. Similarly, the combination of the second input and the pump (represented by level 278) is above the threshold 268.

The pump power is sufficiently high, however, that the sum of the first and second inputs together with the pump (represented by level 280) is above a second threshold 282. At or above this second threshold 282, the optical energy in the gain region 20 induces a refractive index variation that alters the modes supported by the optical cavity 22. For example, the optical cavity 22 may be detuned such that the wavelength of the light emitter in the gain region 20 is not the same as the resonant frequency of the optical cavity. In other embodiments, the optical mode supported by the optical cavity 22 is suppressed. The output of the XOR gate 260 is thus null when both these first and second optical signals are applied to the inputs 262, 264 of the gate.

The optical cavity can additionally be tuned or switched electrically as well as optically. In one embodiment schematically illustrated in FIG. 23A, for example, a laser structure 300 comprising an array 302 of microstructures 304 in an optically transmissive structure 306 additionally comprises electro-optic material. As discussed above, the microstructures 304 disposed in the optically transmissive structure 306 form an optical cavity 308 with a gain region 310 therein. The laser structure 300, however, also includes electrodes 312. This device 300 is electrostatically tunable. A voltage source 314 may be electrically connected to the electrodes 312 to induce an electric field therebetween. As illustrated in FIG. 23B, the microstructures 304 may comprise the electro-optic material. The electrodes 312 are disposed such that the electric field passes through this electro-optic material. The electro-optic material may comprise a nonlinear or electro-optic polymer although other types of nonlinear materials may be used. Application of the electric field through the electro-optic material causes the refractive index of the electro-optic material and consequently that of the optical cavity 308 to vary. As discussed above, refractive index variation may tune or detune the optical cavity 308 or otherwise alter the modes that are supported by the cavity. The electric field could thus be used to suppress or enhance particular optical modes.

Figure 24A:
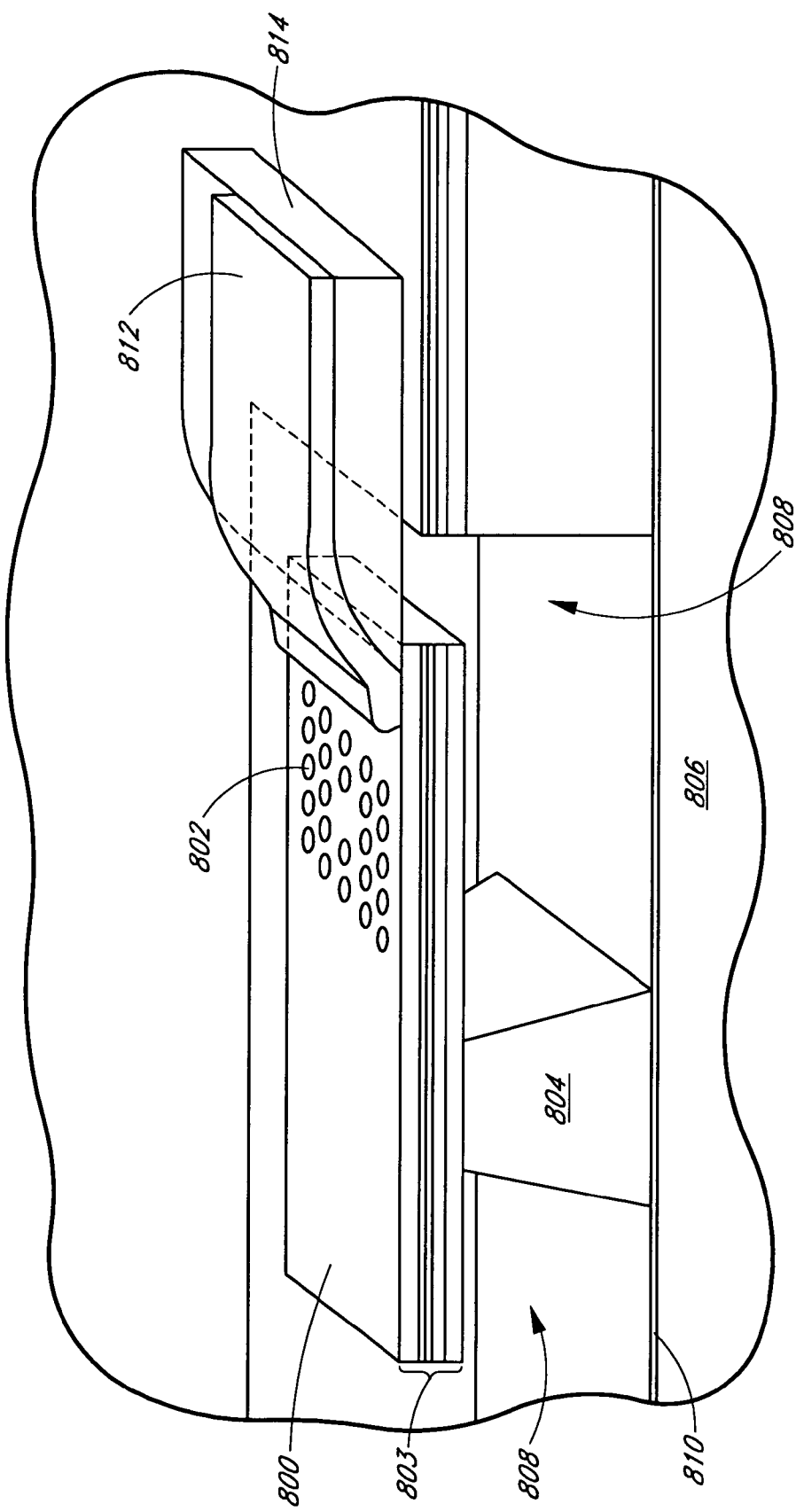
FIGS. 24A and 24B schematically illustrate an alternative contact arrangement.

An alternative configuration for electroding is depicted in FIG. 24A, which shows a microstructure-doped laser structure 800 comprising a quantum well structure having holes 802 formed therein. In this embodiment, the quantum well structure 800 comprises layers of InGaAsP 803. The quantum well structure 800 is mounted on a support 804 that is formed on a substrate 806. The support 804 and substrate 806 both comprises InP. An open region 808 surrounds the support 804. The support 804 is formed from a sacrificial layer deposition and sacrificial etch as discussed more fully below. Accordingly, an etch stop layer 810 is disposed between the support 804 and the substrate 806. An electrical contact 812 is formed with the quantum well structure 800. This electrical contact 812 may comprise metal or metal alloy such as for example Au/Zn. The electrical contact 812 is electrically isolated by an insulating layer 814. This insulating layer 814 may comprise an insulator such as polyimide. Another contact (not shown) may be formed to the substrate.

In certain embodiments, the microstructure-doped laser structure 800 is formed by etching through the multiple quantum well layers 803 and into the sacrificial InP. A sacrificial etch removes InP beneath the microstructure-doped laser structure 800. The microstructures 802 are formed in the multiple quantum well layers 803 and metallization is deposited and patterned to create the contact 812. The intervening layer of polyimide 814 is formed prior to the metallization. Other methods may be employed to form the microstructure-doped laser structure 800.

Figure 24B:
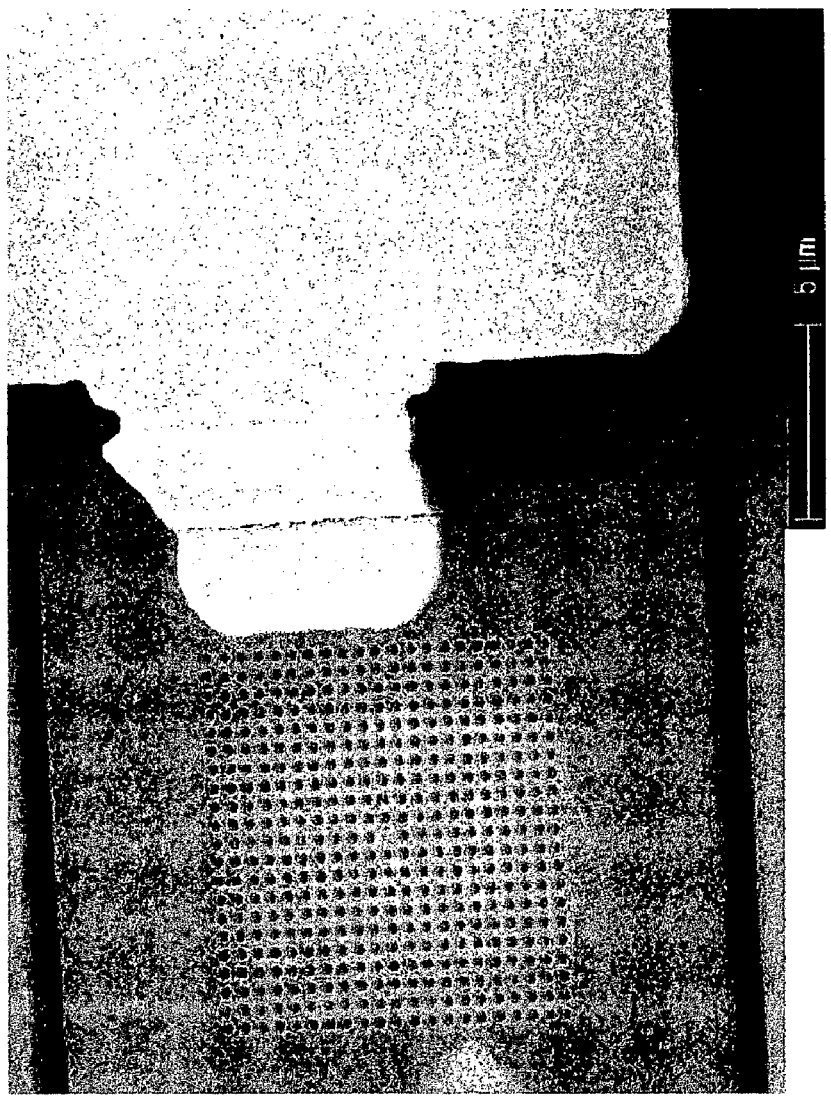

An SEM image of the resultant nanolaser device is shown in FIG. 24B. A voltage may be applied between the contact 812 and the substrate 806 to create an electric field in the multiple quantum well structure 800. Depending on the design, this electric field may be employed to tune an optical cavity in the structure 800 as described above or to electrically pump the laser structure. Other designs are also possible.

Figure 25:
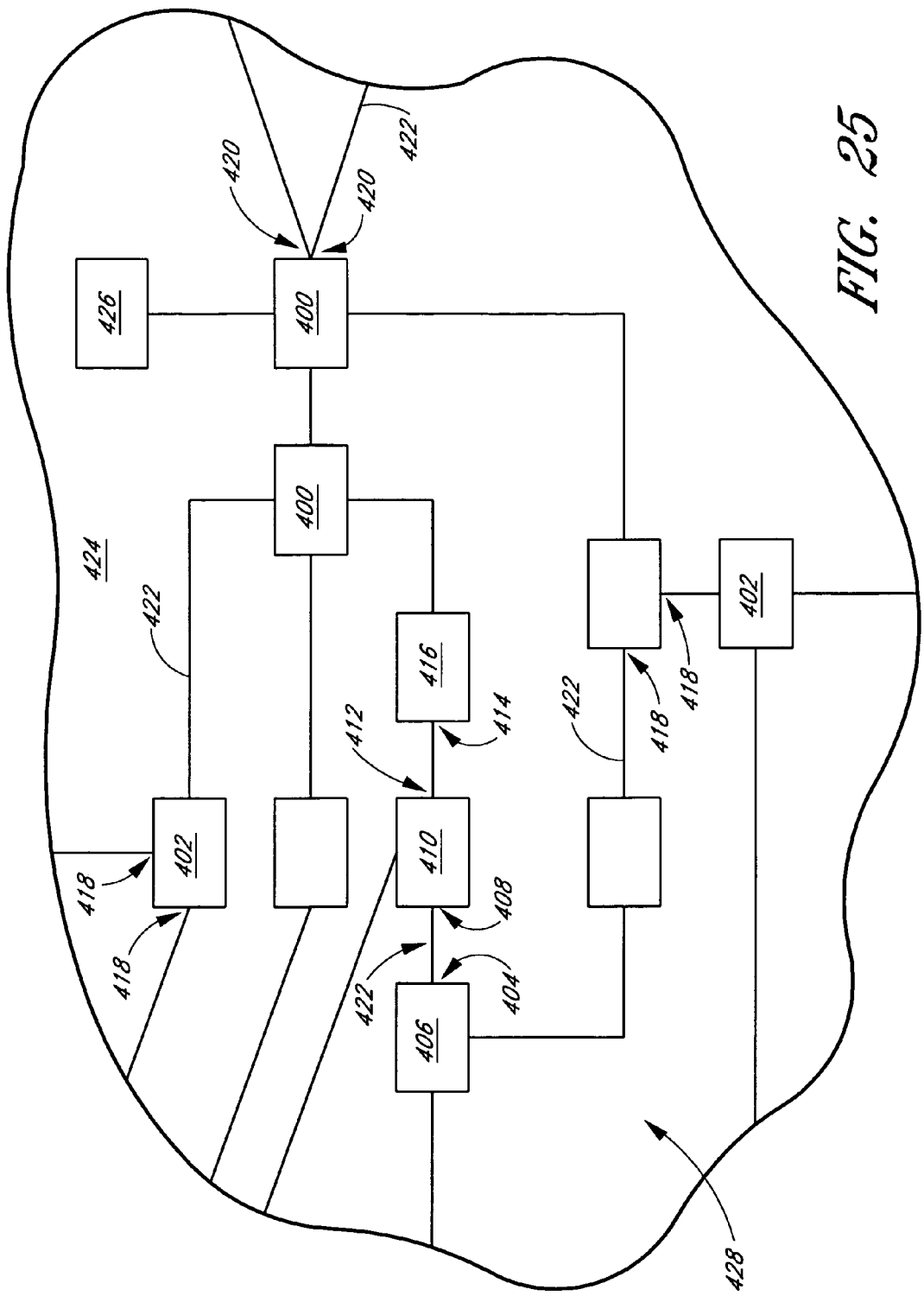
FIG. 25 schematically illustrates a plurality of optical logic devices and switches in an optical integrated circuit.

Optical logic devices 400 and optical switches 402 may be combined together to yield more sophisticated structures as shown in FIG. 25. For example, an output 404 of a first optical logic or switching element 406 may be optically coupled to an input 408 of a second optical logic or switching element 410. Similarly, an output 412 of the second optical logic or switching element 410 may be optically coupled to an input 414 of a third optical logic or switching element 416 and so on. The optical logic devices 400 and optical switches 402 may have one or more input ports 418 and/or one or more output ports 420. Optical connections may be formed with waveguides 422 coupled to the input and output ports 418, 420. These waveguides 422 may comprise microstructure doped waveguides comprising microstructures formed in an optically transmissive medium. Alternatively, these waveguides 422 may comprise other types of waveguides including but not limited to channel waveguides, rib or ridge waveguides, strip loaded waveguides, etc.

The optical logic devices 400 and optical switches 402 may be integrated together monothically on an optical integrated circuit (IC) 424 or chip or portion thereof. These structures 400, 402 may for example be in or on a substrate (not shown) that may or may not have one or more layers (not shown) formed thereon. The substrate may for example comprise InP and multiple layers of III-V material may be formed thereon. Microstructures may be formed in the multiple layers to form the optical logic devices 400 and optical switches 402 and possible optical waveguides that provide optical interconnection as described above. In other embodiments, the substrate may comprise silicon and the microstructures may be formed therein. In some embodiments silicon on insulator may be employed. Other materials may be used as well.

Additional optical components 426 such as detectors and laser sources may also be included and may be optically connected to one or more of the optical logic devices 400 or switches 402. Optical as well as electrical connectors (not shown) may also be included to provide optical or electrical connection. Optical beams may be coupled in-plane from the sides of the monolith structure 424 as well as out-of-plane as described above. In certain embodiments, pumping may be channeled through the monolith structure 424 and distributed to a plurality of optical devices 400 or switches 402. A pumping source (not shown) external to the monolith structure 424 may be employed.

A network 428 of optical logic devices 400 and/or switches 402 may be interconnected together, for example, to provide optical signal processing, to route voice or data signals, to perform computation, etc. In various embodiments, the optical signals will comprise pulses coupled to the switches and logic devices. These pulses may reach different switches 402 and devices 400, 426 at different times as a result in part of different distances that the pulses travel. Advantageously, in certain embodiments waveguide portions 422 that comprise photonic crystal may be used to control the timing of the pulses. By varying characteristics such as spacing and arrangement of the microstructures in photonic crystal waveguide portions 422, optical dispersion may be controlled. Accordingly, the pulses may be propagated through waveguide portions 422 at different speeds depending on the direction of the pulse with respect to the photonic crystal and the relative amount of dispersion. This amount of dispersion may additionally depend on the wavelength and the distance to be traveled as well as the direction of propagation of the light through the photonic crystal. In certain directions, light can be collimated and propagate at close to the speed of light in the photonic crystal structure. In other direction, light can be slowed down by approximately 10 times. The waveguides portions 422 in the network 428 therefore may be configured to provide the proper timing by controlling the propagation speed of the pulse and the distance traveled.

Additionally, to prevent feedback that may degrade performance of the laser structures, the optical logic devices 400 and switches 402 may be designed to output a different wavelength than are input into the respective optical cavity. For example, the first output 404 of the first optical logic or switching element 406 may be a signal at a first wavelength which is coupled to the input 408 of the second optical logic or switching element 410. The output 412 of the second optical logic or switching element 410 may be a signal at a second wavelength which is optically coupled to the input 414 of the third optical logic or switching element 416. Backscatter from the optical logic or switching elements 406, 410, 416 or from the waveguides 422 or as a result of the coupling therebetween may produce a return signal that may enter the optical cavity of the optical logic or switching elements. For example, a portion of the output signal from the second optical logic or switching element 410 may be returned back to the optical cavity of that element. If the input signal that activates this element 410 is a different than the output signal, possible having a shorter wavelength, the portion of the output signal returned to the second optical logic or switching element will less likely interfere with the operation of the element. Other variations in the design and operation of the optical integrated circuit 424 are possible.

Figure 26:
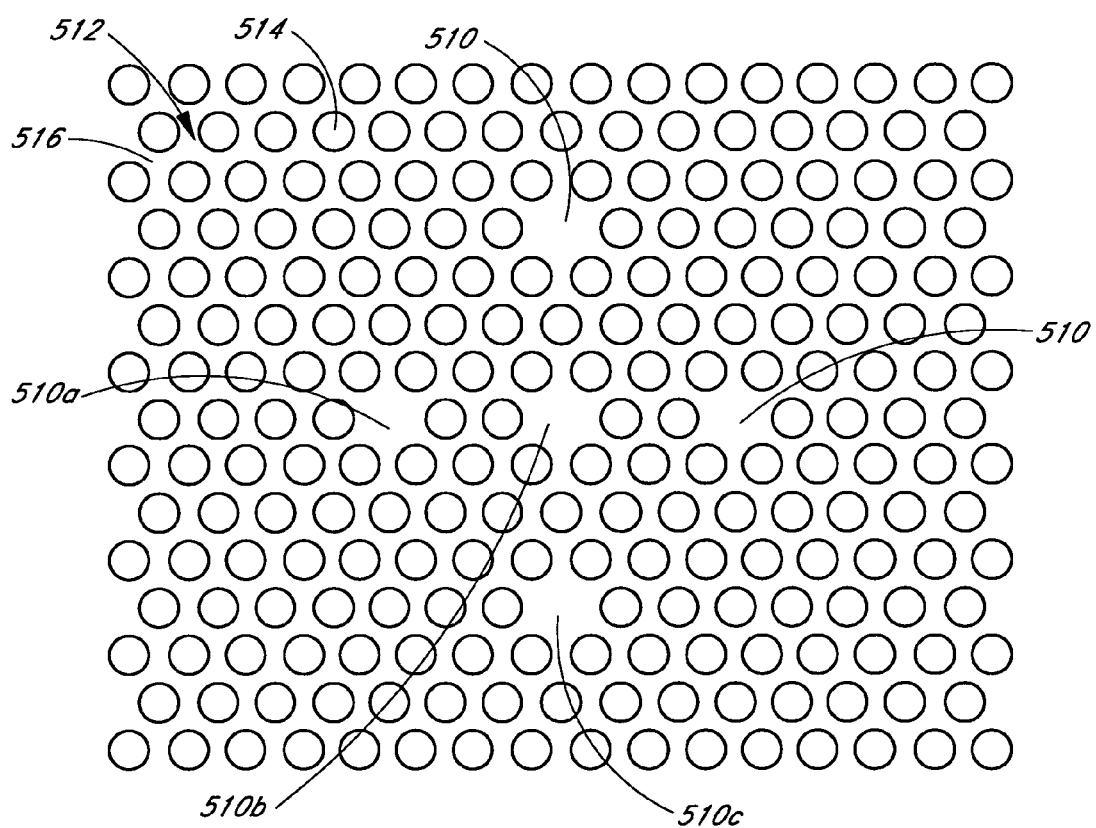
FIG. 26 schematically illustrates a plurality of optical logic devices and/or switches in sufficient proximity to be in optical communication.

FIG. 26 schematically illustrates one example of a plurality of laser cavities 510 integrated together monolithically. A hexagonally closed-packed array 512 of microstructures 514 is formed in a matrix medium 516 that is optically transmissive to the wavelength or wavelengths of operation. Five optical cavities 510 are shown formed where microstructures 514 in the array 512 are absent. The five optical cavities 510, however, are in close proximity to provide optical communication therebetween. For example, light from a first optical cavity 510a may be coupled to a second optical cavity 510b and light from the second optical cavity can be coupled to a third optical cavity 510c or vice versa. In this example, the separation of the optical cavities 510 may be between about 1 micrometers and 100 micrometers, although the separation may be outside this range. In various preferred embodiments, however, separation less is than the coherence length of light emitted from the laser cavities 510. In this or other embodiments, light from the optical cavity 510 may be focused, collimated, or guided to facilitate coupling to another optical cavity or elsewhere. Diffractive losses may be reduced since light beams exiting the cavity 510 and propagating through the matrix 516 do not encounter a large change in refractive index that would introduce optical diffraction out of the plane of the patterned matrix 516.

Massive integration is thus possible. For example, between about 100 and 1,000,000 optical devices and/or switched may be integrated together on a chip. The devices and switches may be between about 0.5 micrometers and 1 micrometers in size and may be separated by between about 1 micrometers and 100 micrometers with or without the use of waveguides. Values outside these ranges are possible.

Moreover, using laser structures for optical logic and switching permits gain to be introduced to the optical signals. Likewise a series of logic gates and switches may be cascaded and the signal may be propagated a distance. Attenuation resulting from loss can be mitigated by this gain.

Accordingly, compact, robust and efficient optical logic and switching systems can be assembled that offer both high speed and high contrast. Radically new system architectures may be enabled, for example, by the optical logic devices and switches, which may be reconfigured as described above. All optical processing, routing, and computing may be implemented. Other applications are possible as well.

The structures and methods may vary from those specifically described herein. For example, the pumping of gates and other logic devices may be employed as an input to actively control the optical logic device. The pump signal directed to logic devices may itself be controlled by switches or logic components to implement more complex operations. Also, the input need not all be optical. For example, an AND gate can have one optical input and one electrical input that are ANDed together. Other variations in the optical logic device and switches and method of implementing the optical logic and switching are also possible.

The methods which are described and illustrated herein is not limited to the exact sequence of acts described, nor is it necessarily limited to the practice of all of the acts set forth. Other sequences of events or acts, or less than all of the events, or simultaneous occurrence of the events, may be utilized in practicing the embodiments of the invention. Additionally, although the invention has been disclosed in the context of certain embodiments and examples, it will be understood by those skilled in the art that the invention extends beyond the specifically disclosed embodiments to other alternative embodiments and/or uses and obvious modifications and equivalents thereof. Accordingly, the invention is not intended to be limited by the specific disclosures of preferred embodiments herein.

What is claimed is:

1. An optical logic device comprising:
    a laser comprising an optical resonator and a quantum dot therein, said optical resonator comprising counter-opposing microstructure-doped mirror portions, said quantum dot disposed between said mirror portions, said microstructure-doped mirror portions comprising of a plurality of microstructures disposed in an optically transmissive structure;
    an optical pump disposed with respect to said optical resonator to pump said quantum dot;
    at least one optical input port to couple light into said laser; and
    at least one optical output port to couple light out of said laser;
    wherein said laser has at least a first state and a second state that affect a characteristic of light coupled out said at least one optical output port, light coupled into said at least one optical input port switching said laser from said first state to said second state.

2. The optical logic device of claim 1, wherein said plurality of microstructures comprises an ordered array of point structures or a disordered array of point structures.

3. The optical logic device of claim 2, wherein said point structures comprise holes in said optically transmissive structure.

4. The optical logic device of claim 2, wherein said microstructure-doped mirror portions comprise photonic crystal mirrors.

5. The optical logic device of claim 1, wherein said optical cavity has a mode volume between about 0.01 cubic micrometers and about 1.0 cubic micrometers.

6. The optical logic device of claim 1, wherein said optically transmissive structure comprises silicon-based material.

7. The optical logic device of claim 1, wherein said optically transmissive structure comprises silicon.

8. The optical logic device of claim 1, wherein said at least one optical input port comprises an optical waveguide.

9. The optical logic device of claim 8, wherein said optical waveguide comprises a microstructure-doped waveguide.

10. The optical logic device of claim 9, wherein said optical waveguide comprises photonic crystal waveguide structure.

11. The optical logic device of claim 1, wherein said at least one optical output comprises an optical waveguide.

12. The optical logic device of claim 11, wherein said optical waveguide comprises a microstructure-doped waveguide.

13. The optical logic device of claim 12, wherein said optical waveguide comprises photonic crystal waveguide structure.

14. The optical logic device of claim 1, wherein said light coupled out said at least one optical output port has a longer wavelength than said light coupled into said at least one optical input port.

15. The optical logic device of claim 1, wherein said optically transmissive structure comprises a polymer material and said microstructures comprise holes in said polymer material.

16. The optical logic device of claim 15, wherein said quantum dot comprises III-V semiconductor material.

17. The optical logic device of claim 16, wherein said III-V semiconductor material comprises InGaAsP material.

18. The optical logic device of claim 15, wherein said polymer material comprises a photorefractive material.

19. The optical logic device of claim 18, wherein said light coupled into said at least one optical input port switching said laser from said first state to said second state causes a photorefractive change in the effective index of refraction of said optical resonator to switch said laser from said first state to said second state.

20. The optical logic device of claim 1, wherein said optical resonator is tuned to the wavelength of light emitted by said quantum dot while in the first state, while said optical resonator is not tuned to the wavelength of light emitted by said quantum dot while in the second state.

21. The optical logic device of claim 1, wherein said optical resonator supports a principal mode having a first spatial extent or polarization while in the first state, and said optical resonator supports a principal mode having a second spatial extent or polarization while in the second state.

22. The optical logic device of claim 1, wherein said optical resonator is tuned to a first wavelength while in the first state and said optical resonator is tuned to a second wavelength while in the second state, said quantum dot being configured to emit both the first and second wavelengths when pumped.

23. The optical logic device of claim 1, wherein said optical resonator supports a first principal mode that propagates in a first direction to a first optical output port while in the first state, and wherein said optical resonator supports a second principal mode that propagates in a second direction to a second optical output port while in the second state.

24. The optical logic device of claim 1, wherein said first state comprises optical energy being present at said optical output port and said second state comprises substantially no optical energy being present at said optical output port.

25. The optical logic device of claim 1, wherein said at least one optical input port and said at least one optical output port are in-plane with respect to the optical logic device.

26. A network of optical logic devices comprising two or more interconnected instances of the optical logic devices of claim 1.

27. The optical logic device of claim 1, wherein said quantum dot comprises III-V semiconductor material.

28. The optical logic device of claim 27, wherein said III-V semiconductor material comprises an InGaAs material.

29. The optical logic device of claim 1, wherein said mirror portions comprise silicon, glass, diamond, a high refractive index oxide, or a polymer.

30. The optical logic device of claim 1, wherein said mirror portions comprise a photorefractive or electro-optic material.

31. The optical logic device of claim 1, wherein said quantum dot has said mirror portions on at least four sides.

32. The optical logic device of claim 1, wherein said quantum dot is configured to emit light of a selected wavelength and said microstructure-doped mirror portions comprise a material substantially transparent to the selected wavelength.

33. An optical logic device comprising:
a laser comprising an optical resonator and a gain region therein, said optical resonator comprising counter-opposing microstructure-doped mirror portions, said gain region disposed between said mirror portions, said microstructure-doped mirror portions comprising of a plurality of microstructures disposed in an optically transmissive structure;
a pump disposed with respect to said optical resonator to pump said gain region;
at least one optical input port disposed with respect to said optical resonator to couple light into said gain region; and
at least one optical output port disposed with respect to said optical resonator to couple light out of said gain region;
wherein said laser has at least a first state and a second state that affect a characteristic of light coupled out said at least one optical output port, light coupled into said at least one optical input port switching said laser from said first state to said second state and wherein said optically transmissive structure comprises a quantum well structure and said microstructures comprise holes in said quantum well structure.

34. The optical logic device of claim 33, wherein said quantum well structure comprises III-V semiconductor material.

35. The optical logic device of claim 34, wherein said III-V semiconductor material comprises InGaAsP material.

36. The optical logic device of claim 33, wherein said gain region comprises a quantum dot.

37. The optical logic device of claim 33, wherein said pump comprises an optical pump.

38. A laser optical logic device comprising:
a laser comprising a quantum dot comprising a first material and configured to emit light of a selected wavelength, said quantum dot having microstructure-doped mirror portions on at least four sides, said mirror portions comprising a second material that is substantially transparent to the selected wavelength, said laser comprising said mirror portions;
a pump disposed with respect to said quantum dot to pump said quantum dot;
at least one optical input port to couple light into said laser; and
at least one optical output port to couple light out of said laser;
wherein said laser has at least a first state and a second state that affect a characteristic of light coupled out said at least one optical output port, light coupled into said at least one optical input port switching said laser from said first state to said second state, and wherein said first material comprises PbS or HgTe and said second material comprises silicon.

39. The laser optical logic device of claim 38, wherein said pump comprises an optical pump.

40. The laser optical logic device of claim 38, wherein said gain region is substantially surrounded by said microstructure-doped mirror portions in a selected plane.

41. A laser optical logic device comprising:

a laser comprising a light emitter comprising a first material and configured to emit light of a selected wavelength, said light emitter being physically embedded in an optically transmissive structure and having microstructure-doped mirror portions on at least four sides, said mirror portions comprising a second material that is substantially transparent to the selected wavelength, said laser comprising said optically transmissive structure;

a pump disposed with respect to said light emitter to pump said light emitter;

at least one optical input port to couple light into said laser; and at least one optical output port to couple light out of said laser;

wherein said laser has at least a first state and a second state that affect a characteristic of light coupled out said at least one optical output port, light coupled into said at least one optical input port switching said laser from said first state to said second state, and wherein said first material comprises PbS or HgTe and said second material comprises silicon.

42. The laser optical logic device of claim 41, wherein the pump comprises an optical pump.

43. The laser optical logic device of claim 41, wherein the light emitter comprises a quantum dot.

* * * * *